United States Patent
Akhbari et al.

(10) Patent No.: US 12,292,351 B2
(45) Date of Patent: May 6, 2025

(54) FORCE-MEASURING DEVICE AND RELATED SYSTEMS

(71) Applicant: UltraSense Systems, Inc., San Jose, CA (US)

(72) Inventors: Sina Akhbari, San Jose, CA (US); Hao-Yen Tang, San Jose, CA (US); Mo Maghsoudnia, San Jose, CA (US)

(73) Assignee: UltraSense Systems, Inc., San Jose, CA (US)

( * ) Notice: Subject to any disclaimer, the term of this patent is extended or adjusted under 35 U.S.C. 154(b) by 1086 days.

(21) Appl. No.: 17/161,610

(22) Filed: Jan. 28, 2021

(65) Prior Publication Data

US 2021/0239553 A1 Aug. 5, 2021

Related U.S. Application Data

(60) Provisional application No. 62/968,068, filed on Jan. 30, 2020.

(51) Int. Cl.
*H01L 41/04* (2006.01)
*B06B 1/02* (2006.01)
(Continued)

(52) U.S. Cl.
CPC ............ *G01L 9/008* (2013.01); *B06B 1/0215* (2013.01); *B06B 1/0292* (2013.01);
(Continued)

(58) Field of Classification Search
CPC ... B06B 1/0215; B06B 1/0292; B06B 1/0603; H10N 30/302; H10N 30/802;
(Continued)

(56) References Cited

U.S. PATENT DOCUMENTS 4,412,544 A 11/1983 Beretsky et al.
8,676,540 B1 3/2014 Welch et al.
(Continued)

FOREIGN PATENT DOCUMENTS

WO WO2018077761 5/2018

*Primary Examiner* — Bryan P Gordon
(74) *Attorney, Agent, or Firm* — Perkins Coie LLP

(57) ABSTRACT

A force-measuring device includes a first substrate, signal processing circuitry, a thin-film piezoelectric stack overlying the first substrate, and piezoelectric micromechanical force-measuring elements (PMFEs). The thin-film piezoelectric stack includes a piezoelectric layer. The PMFEs are located at respective lateral positions along the thin-film piezoelectric stack.
Each PMFE has: (1) a first electrode, (2) a second electrode, and (3) a respective portion of the thin-film piezoelectric stack. The first electrode and the second electrode are positioned on opposite sides of the piezoelectric layer to constitute a piezoelectric capacitor. Each of the PMFEs is configured to output voltage signals (PMFE voltage signals) between the respective first and second electrodes in accordance with a time-varying strain at the respective portion of the piezoelectric layer between the respective first and second electrodes resulting from a low-frequency mechanical deformation. The signal processing circuitry is configured to read at least some of the PMFE voltage signals.

11 Claims, 20 Drawing Sheets

(51) Int. Cl.
*B06B 1/06* (2006.01)
*G01L 9/00* (2006.01)
*G01L 9/08* (2006.01)
*H10N 30/30* (2023.01)
*H10N 30/80* (2023.01)
*H10N 30/853* (2023.01)
*H10N 30/857* (2023.01)
*H10N 30/88* (2023.01)

(52) U.S. Cl.
CPC .............. *B06B 1/0603* (2013.01); *G01L 9/08* (2013.01); *H10N 30/302* (2023.02); *H10N 30/802* (2023.02); *H10N 30/853* (2023.02); *H10N 30/8542* (2023.02); *H10N 30/8554* (2023.02); *H10N 30/8561* (2023.02); *H10N 30/857* (2023.02); *H10N 30/88* (2023.02)

(58) Field of Classification Search
CPC ........... H10N 30/8542; H10N 30/8554; H10N 30/8561; H01N 30/853
See application file for complete search history.

(56) References Cited

U.S. PATENT DOCUMENTS

| | | |
|---|---|---|
| 10,466,844 B1 | 10/2019 | Tang et al. |
| 10,585,534 B2 | 3/2020 | Tang et al. |
| 10,719,175 B2 | 7/2020 | Akhbari et al. |
| 10,775,938 B2 | 9/2020 | Tang et al. |
| 2001/0000666 A1 | 5/2001 | Wood et al. |
| 2002/0005108 A1 | 1/2002 | Ludwig |
| 2003/0144814 A1 | 7/2003 | Hama et al. |
| 2003/0217873 A1 | 11/2003 | Paradiso et al. |
| 2003/0233233 A1 | 12/2003 | Hong |
| 2007/0260425 A1 | 11/2007 | Kim |
| 2008/0316184 A1 | 12/2008 | D'Souza |
| 2009/0157206 A1 | 6/2009 | Weinberg et al. |
| 2009/0224161 A1 | 9/2009 | Fritsch et al. |
| 2010/0117993 A1 | 5/2010 | Kent |
| 2010/0139991 A1 | 6/2010 | Phillip et al. |
| 2010/0258361 A1 | 10/2010 | Yamauchi et al. |
| 2011/0061464 A1 | 3/2011 | Yi-min |
| 2012/0274609 A1 | 11/2012 | Sheng et al. |
| 2013/0345864 A1 | 12/2013 | Park et al. |
| 2014/0022189 A1 | 1/2014 | Sheng et al. |
| 2014/0071095 A1 | 3/2014 | Godsill |
| 2015/0148674 A1 | 5/2015 | Park et al. |
| 2015/0169136 A1 | 6/2015 | Ganti et al. |
| 2016/0216794 A1 | 7/2016 | Yoon et al. |
| 2016/0246449 A1 | 8/2016 | Jarske |
| 2017/0110504 A1* | 4/2017 | Panchawagh ......... H10N 39/00 |
| 2017/0255338 A1 | 9/2017 | Medina |
| 2017/0322290 A1 | 11/2017 | Ng et al. |
| 2017/0336903 A1 | 11/2017 | Rivaud et al. |
| 2017/0336926 A1 | 11/2017 | Chaudhri et al. |
| 2018/0032161 A1 | 2/2018 | Shi et al. |
| 2018/0032211 A1 | 2/2018 | King |
| 2018/0039392 A1 | 2/2018 | Kim et al. |
| 2018/0164937 A1 | 6/2018 | Lynn |
| 2018/0246612 A1 | 8/2018 | Lynn et al. |
| 2018/0276439 A1 | 9/2018 | Strohmann et al. |
| 2018/0276440 A1 | 9/2018 | Strohmann et al. |
| 2018/0276443 A1* | 9/2018 | Strohmann ......... G06V 40/1394 |
| 2018/0284892 A1* | 10/2018 | Kwon .................. G06F 3/0416 |
| 2018/0323783 A1 | 11/2018 | Bang et al. |
| 2018/0369866 A1* | 12/2018 | Sammoura ............. G06F 3/043 |
| 2019/0050618 A1* | 2/2019 | Khuri-Yakub ......... G06V 40/45 |
| 2019/0074833 A1 | 3/2019 | Sheng |
| 2019/0354209 A1 | 11/2019 | Tang et al. |
| 2019/0354210 A1 | 11/2019 | Akhbari et al. |
| 2019/0354237 A1 | 11/2019 | Tang et al. |
| 2019/0354238 A1 | 11/2019 | Akhbari et al. |
| 2021/0181041 A1 | 6/2021 | Tang |
| 2021/0242393 A1 | 8/2021 | Tang |
| 2021/0278926 A1 | 9/2021 | Akhbari et al. |
| 2021/0293641 A1 | 9/2021 | Tu et al. |
| 2021/0293648 A1 | 9/2021 | Tu et al. |

* cited by examiner

FORCE-MEASURING DEVICE AND RELATED SYSTEMS

CROSS-REFERENCE TO RELATED APPLICATION(S)

This application claims the benefit of U.S. Provisional Patent Application No. 62/968,068 filed on Jan. 30, 2020, entitled FORCE-MEASURING DEVICE AND RELATED SYSTEMS which is incorporated herein by reference in its entirety.

BACKGROUND

With advancements in micro-electromechanical systems (MEMS) technologies, it has become possible to fabricate MEMS chips containing arrays of piezoelectric micromechanical ultrasonic transducers (PMUTs). For example, a PMUT can be configured as a transmitter (ultrasonic transmitter) or a receiver (ultrasonic receiver). Accordingly, a MEMS chip containing a PMUT array can be configured to sense touch. However, in some use cases, it would be preferable to enable force-measuring in addition to or in lieu of touch-sensing.

SUMMARY OF THE INVENTION

In one aspect, a force-measuring device includes a first substrate, signal processing circuitry, a thin-film piezoelectric stack overlying the first substrate, and piezoelectric micromechanical force-measuring elements (PMFEs). The thin-film piezoelectric stack includes a piezoelectric layer. The PMFEs are located at respective lateral positions along the thin-film piezoelectric stack. Each PMFE has: (1) a first electrode, (2) a second electrode, and (3) a respective portion of the thin-film piezoelectric stack. The first electrode and the second electrode are positioned on opposite sides of the piezoelectric layer to constitute a piezoelectric capacitor. Each of the PMFEs is configured to output voltage signals between the respective first electrode and the respective second electrode (PMFE voltage signals) in accordance with a time-varying strain at the respective portion of the piezoelectric layer between the respective first electrode and the respective second electrode resulting from a low-frequency mechanical deformation. The signal processing circuitry is configured to read at least some of the PMFE voltage signals.

In another aspect, an apparatus includes a cover layer having an outer surface which can be touched by a digit and an inner surface opposite the outer surface. A force-measuring device is coupled to the inner surface.

In yet another aspect, a system includes a force-measuring device and a touch-sensing subsystem. The touch-sensing subsystem can include ultrasonic transducers. The touch-sensing subsystem can include a capacitive touch panel assembly.

The above summary is not intended to describe each disclosed embodiment or every implementation of the present invention. The description that follows more particularly exemplifies illustrative embodiments. In several places throughout the application, guidance is provided through examples, which examples can be used in various combinations. In each instance of a list, the recited list serves only as a representative group and should not be interpreted as an exclusive list.

BRIEF DESCRIPTION OF THE FIGURES

The disclosure may be more completely understood in consideration of the following detailed description of various embodiments of the disclosure in connection with the accompanying drawings, in which.

DETAILED DESCRIPTION OF ILLUSTRATIVE EMBODIMENTS

The present disclosure relates to force-measuring devices, related apparatuses, and related systems.

In this disclosure:

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the invention.

The terms "comprises" and variations thereof do not have a limiting meaning where these terms appear in the description and claims.

Unless otherwise specified, "a," "an," "the," and "at least one" are used interchangeably and mean one or more than one.

The recitations of numerical ranges by endpoints include all numbers subsumed within that range (e.g., 1 to 5 includes 1, 1.5, 2, 2.75, 3, 3.80, 4, 5, etc.).

For any method disclosed herein that includes discrete steps, the steps may be conducted in any feasible order. And, as appropriate, any combination of two or more steps may be conducted simultaneously.

Figure 1:
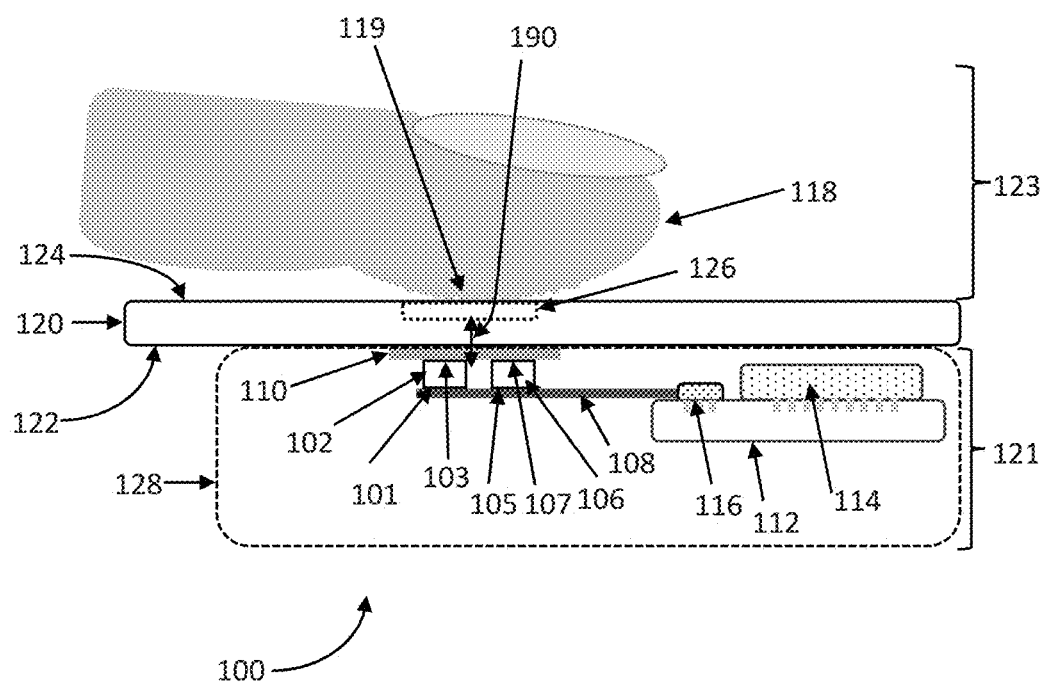
FIG. 1 is a schematic view of an illustrative input system (force-measuring and touch-sensing system).

FIG. 1 is a schematic view of a system or an apparatus 100, referred to herein as an input system or a force-measuring and touch-sensing system. In the example shown, the system 100 includes force-measuring device 102 and a touch-sensing subsystem 106. In other examples, it is possible for a system to have more than one force-measuring device. In other examples, it is possible for a system to have force-measuring functionality but no touch-sensing functionality (for example, the touch-sensing subsystem 106 could be omitted). In the example shown in FIG. 1, each of the force-measuring device 102 and touch-sensing subsystem 106 is shown in the form of a packaged chip. The force-measuring device chip 102 and the touch-sensing subsystem chip 106 have an electrical interconnection surface (bottom surface) 101, 105 and a top surface 103, 107. In cases where a chip includes ultrasonic transducers and the ultrasound signals from the ultrasonic transducers are transmitted through the top surface, the top surface can also be referred to as n ultrasound transmission surface. The sensor chips 102, 106 are mounted to a flexible circuit substrate 108 (e.g., an FPC or flexible printed circuit) on the electrical interconnection surfaces 101, 105. The flexible circuit substrate 108 is electrically and mechanically connected to a printed circuit board (PCB) 112 via a connector 116. Integrated circuits (ICs) 114 are mounted on the PCB 112. Generally, signal processing circuitry can be implemented in the force-measuring device 102, the touch-sensing subsystem 106, and/or the ICs 114. The signal processing circuitry can be implemented in a single IC, or in multiple ICs. ICs 114 can include a microcontroller (MCU), microprocessor (MPU), and/or a digital signal processor (DSP), for example. These ICs 114 could be used to run programs and algorithms to analyze and categorize events based on data received from the sensor chips 102, 106.

Input system 100 includes a cover layer 120 having an exposed outer surface 124 and an inner surface 122 opposite the outer surface. The cover layer 120 should be robust but should be sufficiently deformable such that a deformation of the cover layer is transmitted to the piezoelectric micromechanical force-measuring elements (PMFEs) in the force-measuring device, as described with reference to FIG. 5. If the touch-sensing subsystem 106 or the force-measuring device 102 includes ultrasonic transducers, the cover layer can be a material that transmits ultrasound waves. Examples of robust materials that transmit ultrasound waves are wood, glass, metal, plastic, leather, fabric, and ceramic. The cover layer 120 could also be a composite stack of any of the foregoing materials. The force-measuring device 102 and touch-sensing subsystem 106 are adhered to or attached to (generally, coupled to) the inner surface 122 of the cover layer 120 by a layer of adhesive 110, for example. The choice of adhesive 110 is not particularly limited as long as the devices 102, 106 remain attached to the cover layer. The adhesive 110 could be double-sided tape, pressure sensitive adhesive (PSA), epoxy adhesive, or acrylic adhesive, for example. In some embodiments, the touch-sensing subsystem includes ultrasonic transducers. Ultrasonic transducers that can be fabricated using micro-electromechanical systems (MEMS) technologies include piezoelectric micromechanical ultrasonic transducers (PMUTs) and capacitive micromechanical ultrasonic transducers (CMUTs). In operation, ultrasonic transducers in the touch-sensing subsystem 106 generate ultrasound waves. At least some of the generated ultrasound waves exit the touch-sensing subsystem 106 through the ultrasound transmission surface 107, then through the adhesive layer 110, then through the inner surface 122, and then through the cover layer 120. The ultrasound waves reach a sense region 126 of the exposed outer surface 124. In the example shown, the sense region 126 is a region of the exposed outer surface 124 that overlaps the force-measuring device 102 and touch-sensing subsystem 106. Since PMFEs, PMUTs, and CMUTs can be made using MEMS technology, it is possible to make a force-measuring device that incorporates both force-measuring elements (e.g., PMFEs) and ultrasonic transducers (e.g., PMUTs, CMUTs). Accordingly, a force-measuring device that additionally incorporates touch-sensing functionality is feasible. Such a force-measuring device, additionally incorporating touch-sensing functionality, in an integrated circuit form can be referred to as a force-measuring and touch-sensing integrated circuit or FMTSIC.

FIG. 1 illustrates a use case in which a human finger 118 is touching the cover layer at the touch sense region 126. If there is no object touching the sense region 126, the ultrasound waves that have propagated through the cover layer 120 are reflected at the exposed outer surface (at the air-material interface) and the remaining echo ultrasound waves travel back toward the touch-sensing subsystem 106. On the other hand, if there is a finger 118 touching the sense region, there is relatively large attenuation of the ultrasound waves by absorption through the finger. As a result, it is possible to detect a touch event by measuring the relative intensity or energy of the echo ultrasound waves that reach the touch-sensing subsystem 106.

Both a water droplet and a finger touch might be recognized as "touch" by the touch-sensing subsystem. By using PMFEs, it is possible to distinguish between a finger touching the sense region 126 and a water droplet landing on the sense region 126, for example. When a finger touches the sense region 126, the finger would also exert a force on the cover layer 120. The force exerted by the finger on the cover layer can be detected and measured using the PMFEs in the force-measuring device 102. On the other hand, when a water droplet lands on the sense region, the force exerted by the water droplet as measured at the PMFEs would be quite small, and likely less than a noise threshold. More generally, it is possible to distinguish between a digit that touches and presses the sense region 126 and an inanimate object that comes into contact with the sense region 126. Therefore, by using a combination of PMFEs and a touch-sensing subsystem, touch events can be identified with greater confidence.

FIG. 1 shows a finger-touch zone 119, which is a zone of contact between the finger 118 and the cover layer 120. Finger-touch zone 119 has a size (a lateral dimension) that depends on factors such as size of the finger 118 and whether the finger is a bare finger or a glove-covered finger. Typically, a finger-touch zone 119 can have a size in a range of 3 mm to 7 mm. In the example shown, sensor chips 102 and 106 are separated from each other by a distance smaller than the finger-touch zone 119. Accordingly, sensor chips 102 and 106 can correspond to a single virtual button. An input system (force-measuring and touch-sensing system) can have multiple virtual buttons, and the virtual buttons can be separated from each other by a distance greater than a finger-touch zone.

System 100 can be implemented in numerous apparatuses. For example, the force-measuring devices 102 and/or touch-sensing subsystems 106 can replace conventional buttons on Smartphones, keys on computer keyboards, sliders, or track pads. The interior contents 128 of an apparatus (e.g., force-measuring device 102, touch-sensing subsystem 106, flexible circuit substrate 108, connector 116, PCB 112, ICs 114) can be sealed off from the exterior 123 of the cover layer 120, so that liquids on the exterior 123 cannot penetrate into the interior 121 of the apparatus. The ability to seal the interior of the system from the outside helps to make the apparatus, such as a Smartphone or laptop computer, waterproof. There are some applications, such as medical applications, where waterproof buttons and keyboards are strongly desired. The apparatus can be a mobile appliance (e.g., Smartphone, tablet computer, laptop computer), a household appliance (e.g., television, washing machine, dryer, light switches, air conditioner, refrigerator, oven, remote controller devices), a medical appliance, an industrial appliance, an office appliance, an automobile, or an airplane, for example.

Figure 2:
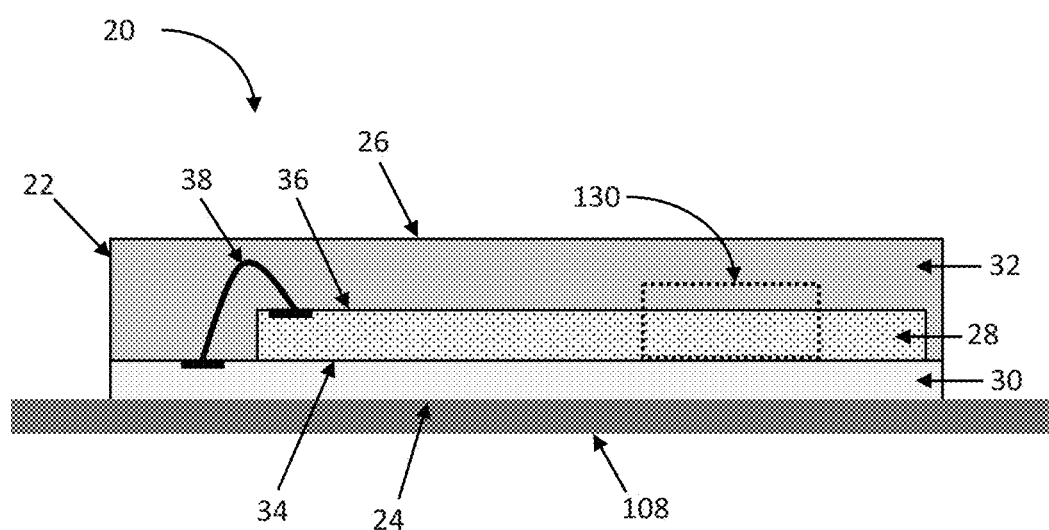
FIG. 2 is a schematic cross-sectional view of a force-measuring device.

The force-measuring device is shown in greater detail in FIG. 2. FIG. 2 is a cross-sectional view of a force-measuring device 20, which is one possible implementation of force-measuring device 102 in FIG. 1. Force-measuring device 20 is shown encased in a package 22, with a top surface 26 and electrical interconnection surface (bottom surface) 24. Top surface 26 is analogous to surface 103 in FIG. 1 and electrical interconnection surface 24 is analogous to surface 101 in FIG. 1. The force-measuring device 20 includes a package substrate 30, semiconductor die (semiconductor chip) 28 mounted to the package substrate 30, and an encapsulating adhesive 32, such as an epoxy adhesive. After the semiconductor die 28 is mounted to the package substrate 30, wire bond connections 38 are formed between the die 28 and the package substrate 30. Then the entire assembly including the die 28 and the package substrate 30 are molded (encapsulated) in an epoxy adhesive 32. In the example shown in FIG. 1, the epoxy side (top surface 26) of the force-measuring device 102 is adhered to (coupled to) the inner surface 122 of the cover layer 120. The force-measuring device 102 is shown mounted to the flexible circuit substrate 108. It is preferable that the force-measuring device have lateral dimensions no greater than 10 mm by 10 mm. In the example shown, the wire bond connection is formed between the top surface 36 of the semiconductor die 28 and the package substrate 30. Alternatively, electrical interconnections can be formed between the bottom surface 34 of the semiconductor die 28 and the package substrate. The semiconductor die 28 consists of an application-specific integrated circuit (ASIC) portion and a micro-electromechanical systems (MEMS) portion. A selected portion 130 of the semiconductor die 28 is shown in cross-section in FIG. 3. A method 650 of making the force-measuring device 20 and of making an input system incorporating the force-measuring device 20 is described with reference to FIG. 27.

Figure 3:
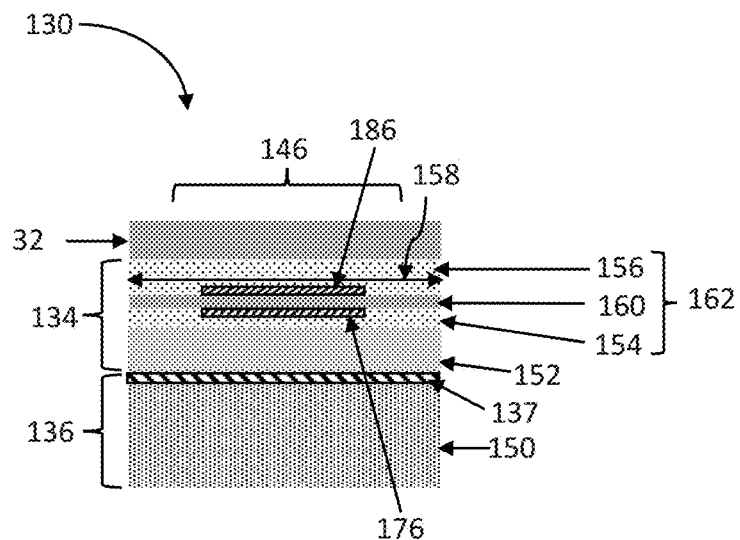
FIG. 3 is a schematic cross-sectional view of a piezoelectric micromechanical force-measuring element (PMFE) of the force-measuring device of FIG. 2.

FIG. 3 is a schematic cross-sectional view of a portion 130 of the force-measuring device 20 of FIG. 2. The semiconductor die 28 includes a MEMS portion 134 and an ASIC portion 136 underneath the PMFE 146. Also shown is an encapsulating adhesive 32 that is above the PMFE 146. Comparing the ASIC portion 136 and the MEMS portion 134, the MEMS portion 134 is closer to the top surface 26 and the ASIC portion 136 is closer to the electrical interconnection surface 24. The ASIC portion 136 consists of a semiconductor substrate 150 and signal processing circuitry 137 thereon or therein. Typically, the semiconductor substrate is a silicon substrate, but other semiconductor substrates such as silicon-on-insulator (SOI) substrates can also be used.

The MEMS portion 134 includes a PMFE 146. The MEMS portion 134 includes a thin-film piezoelectric stack 162 overlying the semiconductor substrate 150. The thin-film piezoelectric stack 162 includes a piezoelectric layer 160, which is a layer exhibiting the piezoelectric effect. Suitable materials for the piezoelectric layer 160 are aluminum nitride, scandium-doped aluminum nitride, polyvinylidene fluoride (PVDF), lead zirconate titanate (PZT), $K_xNa_{1-x}NbO_3$ (KNN), quartz, zinc oxide, lithium niobate, and $Bi_{0.5}Na_{0.5}TiO_3$ (BNT), for example. For example, the piezoelectric layer is a layer of aluminum nitride having a thickness of approximately 1 µm. The piezoelectric layer 160 has a top major surface 166 and a bottom major surface 164 opposite the top major surface 166. In the example shown, the thin-film piezoelectric stack 162 additionally includes a top mechanical layer 156, attached to or adjacent to (coupled to) top major surface 166, and a bottom mechanical layer 154, attached to or adjacent to (coupled to) bottom major surface 164. In the example shown, the thickness of the top mechanical layer 156 is greater than the thickness of the bottom mechanical layer 154. In other examples, the thickness of the top mechanical layer 156 can be smaller than the thickness of the bottom mechanical layer 154. Suitable materials for the mechanical layer(s) are silicon, silicon oxide, silicon nitride, and aluminum nitride, for example. Suitable materials for the mechanical layer(s) can also be a material that is included in the piezoelectric layer 160, which in this case is aluminum nitride. In the example shown, the top mechanical layer and the bottom mechanical layer contain the same material. In other examples, the top mechanical layer and the bottom mechanical layer are of different materials. In other examples, the top mechanical layer and/or the bottom mechanical layer can be omitted. The mechanical layer(s) adjust the mechanical properties of the thin-film piezoelectric stack 162. When coupled to the cover layer, the force-measuring device 20 is preferably oriented such that the piezoelectric layer 160 faces toward the cover layer 120. For example, the force-measuring device 20 is oriented such that the piezoelectric layer 160 and the cover layer 120 are approximately parallel.

For ease of discussion, only one PMFEs is shown in FIG. 3. However, a typical force-measuring device may contain multiple PMFEs. The PMFEs are located at respective lateral positions along the thin-film piezoelectric stack 162. An insulating support layer 152 supports the thin-film piezoelectric stack. Suitable materials for the support layer 152 are silicon, silicon nitride, and silicon oxide, for example. Suitable materials for the support layer 152 can also be a material that is included in the piezoelectric layer 160, which in this case is aluminum nitride.

Each PMFE 146 includes a respective portion of the thin-film piezoelectric stack 162. Each PMFE 146 includes a first PMFE electrode 176 positioned on a first side (bottom surface) 164 of the piezoelectric layer 160 and a second PMFE electrode 186 positioned on a second side (top surface) 166 opposite the first side. The first PMFE electrode 176 and the second PMFE electrode 186 are positioned on opposite sides of the piezoelectric layer 160. In each PMFE 146, the first PMFE electrode 176, the second PMFE electrode 186, and the portion of the piezoelectric layer 160 between them constitute a piezoelectric capacitor. The PMFEs are coupled to the signal processing circuitry 137 as explained in detail hereinbelow.

Figure 4:
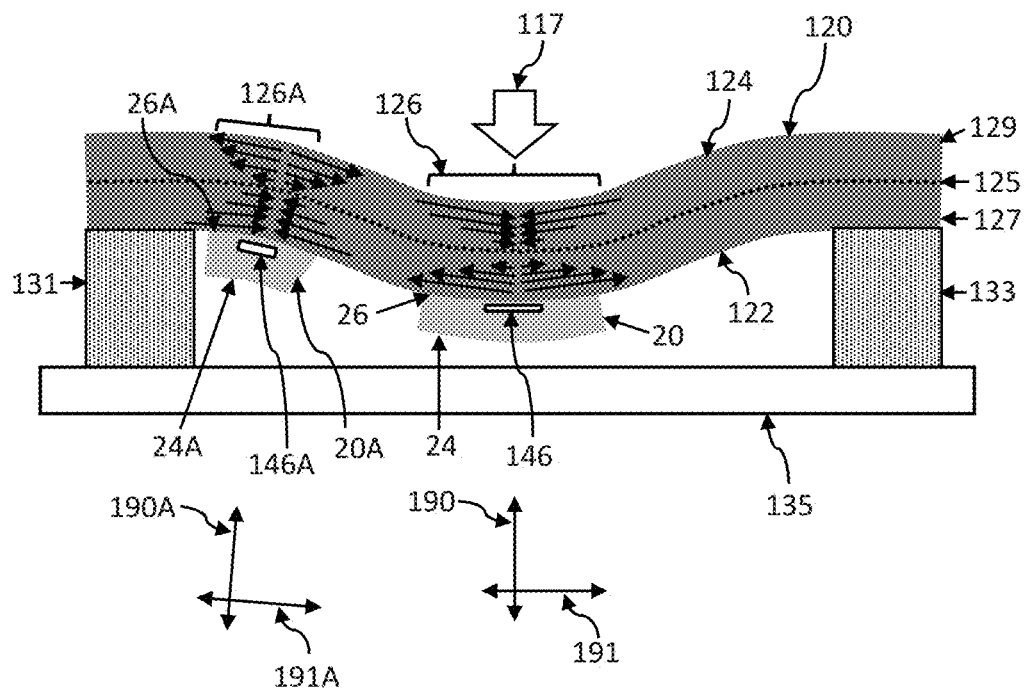
FIGS. 4, 5, and 6 are schematic side views of force-measuring device(s) and a cover layer, attached to each other and undergoing deformation.
Figure 5:
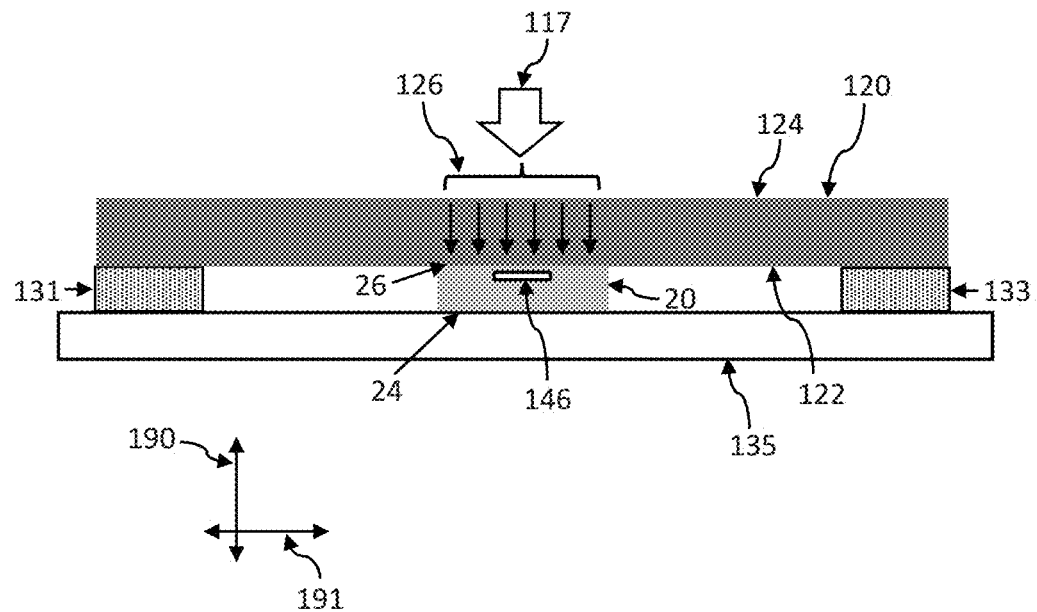
Figure 6:
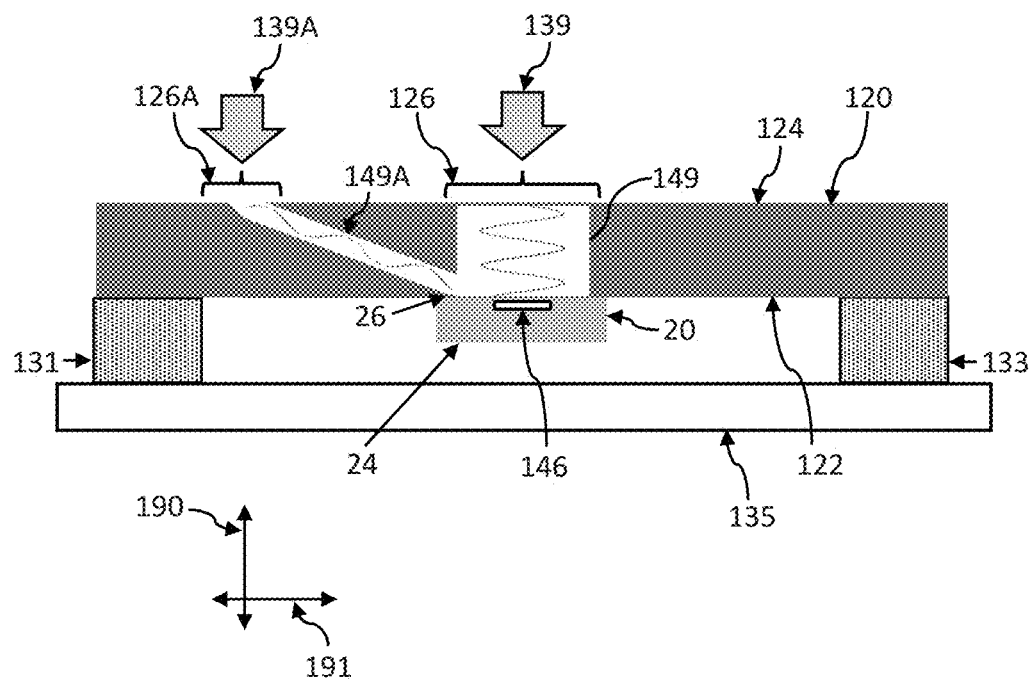

FIG. 3 shows the PMFE in a quiescent state, in which there is no flexing of the piezoelectric stack 162. In the quiescent state, there is no voltage generated between the PMFE electrodes (176, 186). FIGS. 4, 5, and 6 are schematic side views of a force-measuring device 20 and a cover layer 120 attached to or adhered to (coupled to) each other. A top surface 26 of force-measuring device 20 is coupled to inner surface 122 of the cover layer 120. Force-measuring device 20 and cover layer 120 overlie a rigid substrate 135. For ease of viewing, other components of system 100 (e.g., flexible circuit 108, ICs 114) have been omitted. Force-measuring device 20 includes PMFEs 146. In the examples shown, two anchor posts 131, 133 fix the two ends of the cover layer 120 to the substrate 135.

In the example of FIG. 4, force-measuring device 20 is not anchored to the rigid substrate 135 and can move with the cover layer 120 when the cover layer 120 is deflected upwards or downwards. A downward force 117, shown as a downward arrow, is applied by a finger (or another object) pressing against the outer surface 124 of the cover layer 120 at the sense region 126 for example. A finger pressing against or tapping the outer surface 124 are examples of touch excitation, or more generally, excitation. In the example shown in FIG. 4, the cover layer 120 is deflected in a first direction (e.g., downwards) in response to a touch excitation at the sense region 126. Force-measuring device 20 is located approximately half-way between the anchor posts 131, 133 and sense region 126 overlaps force-measuring device 20. A neutral axis 125 is located within the cover layer 120. A lower portion 127 of the cover layer 120, below the neutral axis 125, is under tensile (positive) strain at the sense region 126, represented by outward pointing arrows, primarily along lateral direction 191, perpendicular to the normal direction 190. Normal direction 190 is normal to the piezoelectric layer 160. Normal direction 190 is approximately normal to a plane of the respective piezoelectric capacitor. The piezoelectric layer 160 has a built-in polarization (piezoelectric polarization) that is approximately parallel to normal direction 190. The lateral direction 191 is approximately parallel to the piezoelectric layer 160 at the respective location of the piezoelectric layer 160 (at region 126). An upper portion 129 of the cover layer 120, above the neutral axis 125, is under compressive (negative) strain at the sense region 126, represented by inward pointing arrows, primarily along lateral direction 191. Since force-measuring device 20 is coupled to the inner surface 122, adjacent to the lower portion 127, the PMFEs 146 are also under tensile (positive) strain. Typically, the entire force-measuring device 20 may be deflected under the applied downward force 117. In the example shown in FIG. 4, the PMFEs 146 are under a positive strain, and the respective portions of the piezoelectric layer 160 at the PMFEs 146 undergo expansion along a lateral direction 191. As a result, an electrical charge is generated at each PMFE (146) between the respective PMFE electrodes (176, 186). This electrical charge is detectable as a first deflection voltage $V_{d1}$ (corresponding to strain of a certain polarity and magnitude). The polarity of the first deflection voltage $V_{d1}$ at a PMFE depends upon the polarity of the strain (positive strain (tensile) or negative strain (compressive)) at the respective portion of the piezoelectric layer between the respective PMFE electrodes of the PMFE. The magnitude of the first deflection voltage $V_{d1}$ at a PMFE depends upon the magnitude of the strain at the respective portion of the piezoelectric layer between the respective PMFE electrodes of the PMFE. Subsequently, when the downward force 117 is no longer applied to the sense region 126, the cover layer 120 deflects in a second direction opposite the first direction (e.g., upwards). This is detectable as a second deflection voltage $V_{d2}$ (corresponding to strain of a certain polarity and magnitude). The polarity of the second deflection voltage $V_{d2}$ at a PMFE depends upon the polarity of the strain at the respective portion of the piezoelectric layer between the respective PMFE electrodes of the PMFE. The magnitude of the second deflection voltage $V_{d2}$ at a PMFE depends upon the magnitude of the strain at the respective portion of the piezoelectric layer between the respective PMFE electrodes of the PMFE.

FIG. 4 shows a second force-measuring device 20A, including PMFEs 146A. A top surface 26A of force-measuring device 20A is coupled to inner surface 122 of the cover layer 120. Force-measuring device 20A overlies the rigid substrate 135 and is located at a second region 126A, between anchor post 131 and first force-measuring device 20. Note that force-measuring device 20A is laterally displaced from the location where the downward force 117 is applied to the outer surface 124 (at sense region 126). The lower portion 127 of the cover layer 120 is under compressive (negative) strain at the second region 126A, represented by inward pointing arrows, primarily along the lateral direction 191A, perpendicular to the normal direction 190A. The lateral direction 191A is approximately parallel to the piezoelectric layer 160 at the respective location of the piezoelectric layer 160 (at second region 126A). The upper portion 129 of the cover layer 120 is under tensile (positive) strain at the second region 126A, represented by outward pointing arrows, primarily along the lateral direction 191A. Since force-measuring device 20A is coupled to the inner surface 122, adjacent to the lower portion 127, the PMFEs 146A are also under compressive (negative) strain. These examples illustrate that when the cover layer and the force-measuring devices undergo deflection in response to a touch excitation at the outer surface, expansion and/or compression of the piezoelectric layer along the lateral direction may be induced by the deflection of the cover layer.

In the example shown in FIG. 5, the bottom surface 24 of force-measuring device 20 is anchored to the rigid substrate 135. When downward force 117 is applied to the outer surface 124 of the cover layer 120 at sense region 126, the portion of the cover layer 120 at the sense region 126 transmits the downward force along normal direction 190. The portion of the cover layer 120 at the sense region 126 and the force-measuring device 20 undergo compression along normal direction 190. Consequently, the PMFEs 146 including piezoelectric layer 160 are compressed along the normal direction 190, approximately normal to the piezoelectric layer 160. As a result, an electrical charge is generated between the PMFE electrodes (176, 186). This electrical charge is detectable as a voltage $V_c$ (corresponding to a strain of a certain polarity and magnitude) between the PMFE electrodes. The downward force 117 that causes this compression is applied during a touch excitation, such as tapping at or pressing against the outer surface 124. The pressing or the tapping can be repetitive. Typically, the entire force-measuring device 20 may undergo compression. Subsequently, the piezoelectric layer 160 relaxes from the compressed state. In other cases, there may also be compression along a lateral direction 191, or along other directions.

In the example shown in FIG. 6, force-measuring device 20 is not anchored to the rigid substrate 135. A downward force 139, shown as a downward arrow, is applied to the outer surface 124 of the cover layer 120 at the sense region 126. The downward force 139 is generated as a result of an impact of touch excitation at the sense region 126. For example, the downward force 139 is generated as a result of the impact of a finger (or another object) tapping the outer surface at the sense region 126. The touch excitation (e.g., tapping) can be repetitive. The impact of the touch excitation (e.g., tapping) generates elastic waves that travel outward from the location of the impact (on the outer surface 124 at sense region 126) and at least some of the elastic waves travel toward the inner surface 122. Accordingly, at least some portion 149 of the elastic waves are incident on the force-measuring device 20.

In general, an impact of a touch excitation (e.g., tapping) on a surface of a stack (e.g., cover layer) can generate different types of waves including pressure waves, shear waves, surface waves and Lamb waves. Pressure waves, shear waves, and surface waves are in a class of waves called elastic waves. Pressure waves (also called primary waves or P-waves) are waves in which the molecular oscillations (particle oscillations) are parallel to the direction of propagation of the waves. Shear waves (also called secondary waves or S-waves) are waves in which the molecular oscillations (particle oscillations) are perpendicular to the direction of propagation of the waves. Pressure waves and shear waves travel radially outwards from the location of impact. Surface waves are waves in which the energy of the waves are trapped within a short depth from the surface and the waves propagate along the surface of the stack. Lamb waves are elastic waves that can propagate in plates. When an object (e.g., a finger) impacts a surface of a stack, different types of elastic waves can be generated depending upon the specifics of the impact (e.g., speed, angle, duration of contact, details of the contact surface), the relevant material properties (e.g., material properties of the object and the stack), and boundary conditions. For example, pressure waves can be generated when an impact of a touch excitation at the outer surface is approximately normal to the outer surface. For example, shear waves can be generated when an impact of a touch excitation at the outer surface has a component parallel to the outer surface, such as a finger hitting the outer surface at an oblique angle or a finger rubbing against the outer surface. Some of these elastic waves can propagate towards the force-measuring device 20 and PMFEs 146. If the stack is sufficiently thin, then some portion of surface waves can propagate towards the force-measuring device 20 and PMFEs 146 and be detected by the PMFEs 146.

Accordingly, when elastic waves 149 are incident on the force-measuring device 20 and PMFEs 146, the elastic waves induce time-dependent oscillatory deformation to the piezoelectric layer 160 at the PMFE 146. This oscillatory deformation can include: lateral deformation (compression and expansion along the lateral direction 191 approximately parallel to piezoelectric layer 160), normal deformation (compression and expansion along the normal direction 190 approximately normal to the piezoelectric layer 160), and shear deformation. As a result, time-varying electrical charges are generated at each PMFE (146) between the respective PMFE electrodes (176, 186). These time-varying electrical charges are detectable as time-varying voltage signals. The signal processing circuitry amplifies and processes these time-varying voltage signals. Typically, the time-dependent oscillatory deformations induced by an impact of a touch excitation are in a frequency range of 10 Hz to 1 MHz. For example, suppose that elastic waves 149 include pressure waves incident on the PMFEs 146 along the normal direction 190; these pressure waves may induce compression (under a positive pressure wave) and expansion (under a negative pressure wave) of the piezoelectric layer 160 along the normal direction 190. As another example, suppose that elastic waves 149 include shear waves incident on the PMFEs 146 along the normal direction 190; these shear waves may induce compression and expansion of the piezoelectric layer 160 along the lateral direction 191.

Consider another case in which a downward force 139A, shown as a downward arrow, is applied to the outer surface 124 at a second region 126A, between anchor post 131 and force-measuring device 20. The downward force 139A is generated as a result of an impact of touch excitation at the second region 126A. The impact of the touch excitation generates elastic waves that travel outward from the location of the impact (region 126A) and at least some of the elastic waves travel towards the inner surface 122. Accordingly, at least some portion 149A of the elastic waves are incident on the force-measuring device 20, causing the piezoelectric layer 160 to undergo time-dependent oscillatory deformation. As a result, time-varying electrical charges are generated at each PMFE (146) between the respective PMFE electrodes (176, 186). These time-varying electrical charges are detectable as time-varying voltage signals, although the impact of the touch excitation occurred at a second region 126A that is laterally displaced from the sense region 126.

Elastic waves 149A that reach force-measuring device 20 from region 126A may be weaker (for example, smaller in amplitude) than elastic waves 149 that reach force-measuring device 20 from sense region 126, because of a greater distance between the location of impact and the force-measuring device. An array of PMFEs can be configured to be a position-sensitive input device, sensitive to a location of the impact (e.g., tapping) of a touch excitation. An array of PMFEs can be an array of PMFEs in a single force-measuring device or arrays of PMFEs in multiple force-measuring devices. For example, a table input apparatus could have an array of force-measuring devices located at respective lateral positions underneath the table's top surface, in which each force-measuring device would contain at least one PMFE and preferably multiple PMFEs. The signal processing circuitry can be configured to amplify and process the time-varying voltage signals from the PMFEs and analyze some features of those time-varying voltage signals. Examples of features of time-varying voltage signals are: (1) amplitudes of the time-varying voltage signals, and (2) the relative timing of time-varying voltage signals (the "time-of-flight"). For example, a PMFE exhibiting a shorter time-of-flight is closer to the location of impact than another PMFE exhibiting a longer time-of-flight. The signal processing circuitry can analyze features of time-varying signals (e.g., amplitude and/or time-of-flight) from the PMFEs in an array of PMFEs to estimate a location of impact of a touch excitation.

In operation, PMFE 146 is configured to output voltage signals between the PMFE electrodes (176, 186) in accordance with a time-varying strain at the respective portion of the piezoelectric layer between the PMFE electrodes (176, 186) resulting from a low-frequency mechanical deformation. A touch excitation at the cover layer or at another component mechanically coupled to the cover layer causes a low-frequency mechanical deformation (of the cover layer or other component at the point of excitation). The touch excitation induces effects including deflection (as illustrated in FIG. 4), compression (as illustrated in FIG. 5), and/or elastic-wave oscillations (as illustrated in FIG. 6). In an actual touch event, more than one of these effects may be observable. Consider tapping by a finger as an example of a touch excitation. As the finger impacts the outer surface 124, elastic waves are generated which are detectable as time-varying voltage signals at the PMFEs (FIG. 6). Elastic waves are generated by the impact of the touch excitation. Subsequently, as the finger presses against the cover layer, the force-measuring device undergoes deflection (FIG. 4). There is expansion or compression of the piezoelectric layer along a lateral direction. The low-frequency mechanical deformation can be caused by a finger pressing against or tapping at outer surface of the cover layer 120, to which the force-measuring device 20 is attached (coupled). The PMFE 146 is coupled to the signal processing circuitry 137. The signal processing circuitry is configured to read at least some of the PMFE voltage signals. By amplifying and processing the voltage signals from the PMFE at the signal processing circuitry, the strain that results from the mechanical deformation of the piezoelectric layer can be measured.

It is possible to adjust the relative amplitudes of the PMFE voltage signals attributable to the elastic-wave oscillations (FIG. 6) and lateral expansion and compression due to deflection (FIG. 4). For example, one can choose the cover layer to be more or less deformable. For example, the cover layer 120 of FIG. 6 may be thicker and/or made of more rigid material than the cover layer 120 of FIG. 4.

Figure 30:
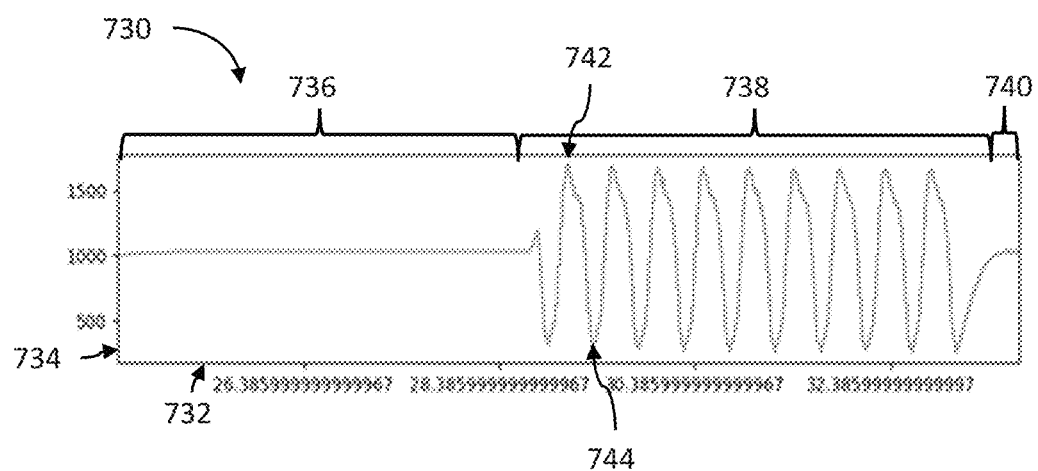
FIG. 30 is a diagram showing a graphical plot of PMFE digital data in response to an example touch event.

PMFE 146 is configured to output voltage signals between the PMFE electrodes (176, 186) in accordance with a time-varying strain at the respective portion of the piezoelectric layer between the PMFE electrodes (176, 186) resulting from a low-frequency mechanical deformation. Typically, the low-frequency deformation is induced by touch excitation which is not repetitive (repetition rate is effectively 0 Hz) or is repetitive having a repetition rate of 100 Hz or less, or 10 Hz or less. These repetition rates correspond to the repetition rates of a repetitive touch excitation, e.g., a finger repeatedly pressing against or tapping the sense region. Illustrative PMFE data measured during a repetitive touch event (finger touching and pressing the cover layer repeatedly) is shown in FIG. 30.

A touch excitation, or more generally, excitation can occur somewhere other than at the sense region. Consider an implementation of force-measuring devices in a portable apparatus, such as a smartphone. In some cases, the cover layer, to which the force-measuring device is coupled, can be a portion of the smartphone housing, and in other cases, the housing and the cover layer can be attached to each other, such that forces applied to the housing can be transmitted to the cover layer. We can refer to both cases as a component (e.g., housing) being mechanically coupled to the cover layer. Excitation such as bending of, twisting of, pinching of, typing at, and tapping at the housing can also cause low-frequency mechanical deformation. For example, typing at the housing can include typing at a touch panel of the smartphone. There can be a time-varying strain (force) at a respective portion of the piezoelectric layer at a PMFE resulting from this low-frequency deformation.

Figure 7:
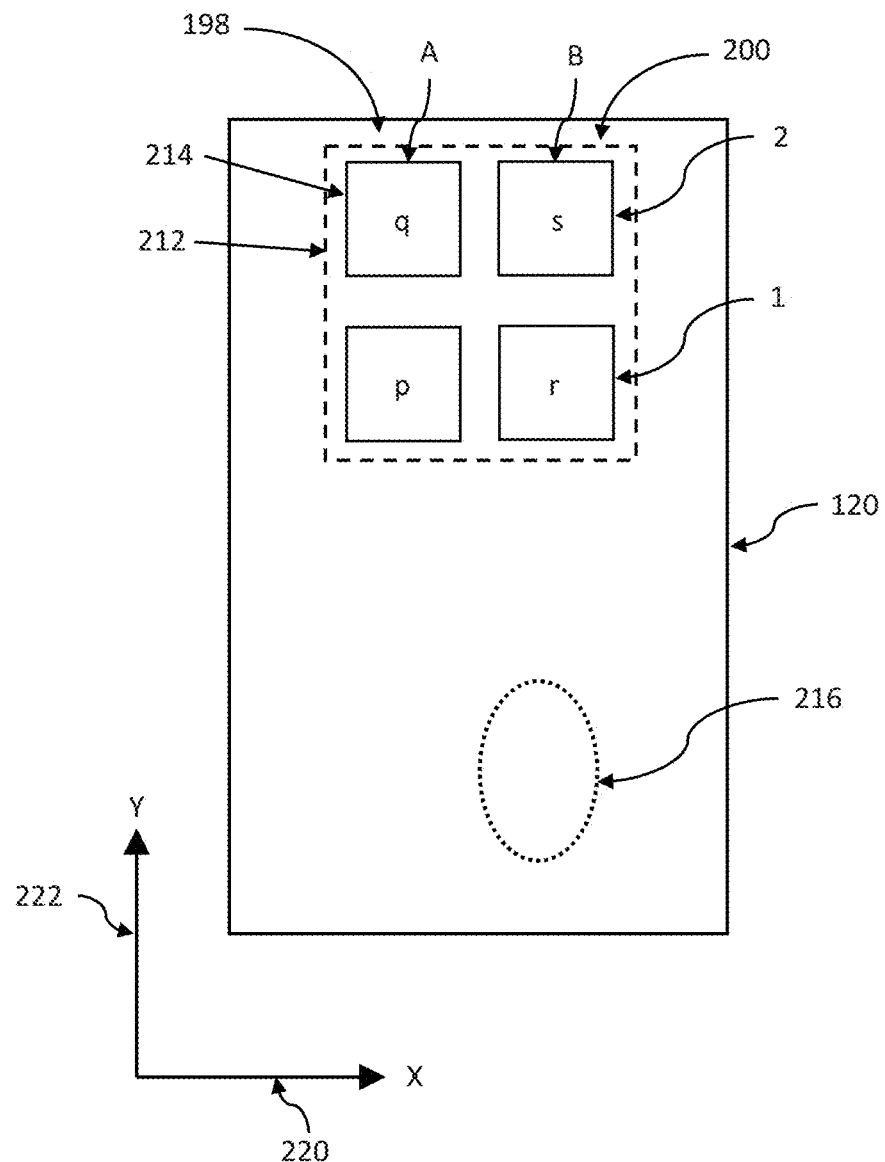
FIGS. 7, 8, and 9 are schematic top views of PMFE arrays of force-measuring devices.

A force-measuring device may contain multiple PMFEs. FIG. 7 is a top view of an example MEMS portion 200 of a force-measuring device 198. The MEMS portion includes four PMFEs (214, locations identified as p, q, r, and s) arranged in a two-dimensional array 212 extending along the X-axis (220) and Y-axis (222). The PMFEs are arranged in columns (A and B) and rows (1 and 2). In the example shown, the two-dimensional PMFE array 212 has a square outer perimeter, but in other examples the outer perimeter can have other shapes such as a rectangle. The force-measuring device is coupled to a cover layer 120. The cover layer 120 is shown overlying the PMFEs 214. Each PMFE measures the strain (force) at a respective X and Y location. For example, the PMFE 214 at location q measures the strain at the piezoelectric layer between the electrodes of that PMFE. Therefore, the PMFE array 212 achieves a two-dimensional positional resolution of strain (force) measurement. The source of this strain (e.g., touch excitation by a finger at the cover layer 120) could be at location q, p, r, s, or another location on the cover layer 120, such as location 216, displaced from all of the PMFEs 214. Suppose that we wish to set up a virtual button approximately corresponding to the PMFE array region 212. In this case, we would configure the PMFEs and the cover layer such that PMFE signals measured from a typical touch excitation at locations outside the PMFE array region (e.g., location 216) would be below a predetermined threshold. On the other hand, suppose that we wish to set up a virtual button approximately corresponding to the cover layer region 120. In this case, we would configure the PMFEs and the cover layer such that PMFE digital data arising from a typical touch excitation any location within the cover layer region 120 would be above a predetermined threshold.

Figure 8:
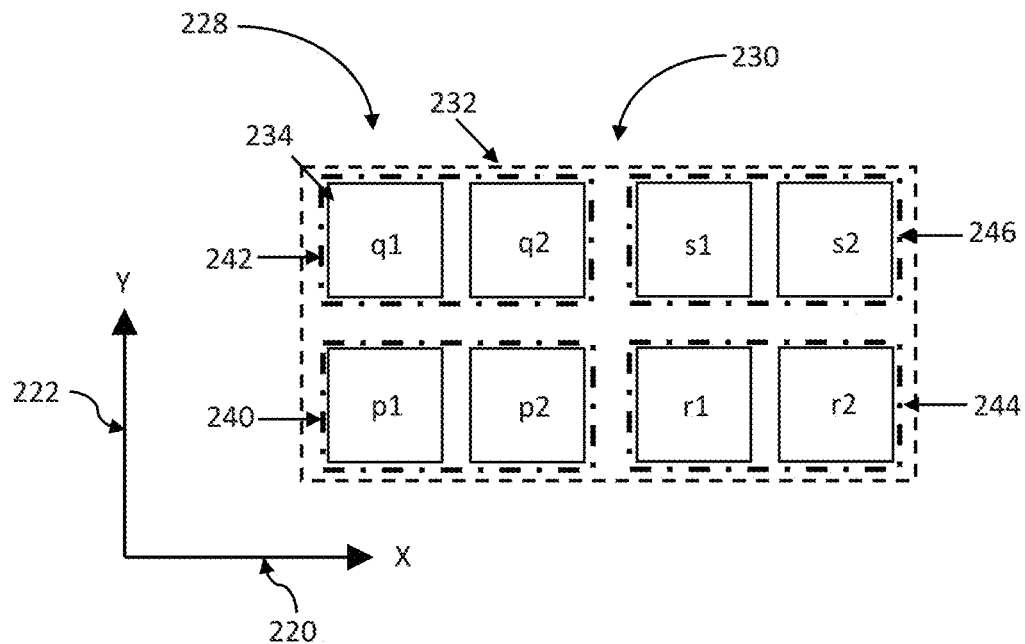

FIG. 8 is a top view of an example MEMS portion 230 of a force-measuring device 228. The MEMS portion includes a two-dimensional PMFE array 232 containing eight PMFEs (234). The PMFEs are arranged into four sets (240, 242, 244, and 246), where each set is associated with a different X and Y location. Therefore, the PMFE array 232 achieves a two-dimensional positional resolution of strain (force) measurement. Each PMFE set contains two PMFEs. In the example shown, set 240 contains PMFEs p1 and p2, set 242 contains PMFEs q1 and q2, set 244 contains PMFEs r1 and r2, and set 246 contains PMFEs s1 and s2. Note that in each set, the two PMFEs are laid side-by-side in the X-direction. The PMFEs in a set are electrically connected to each other. The electrical connections among the PMFEs in a set are described in detail hereinbelow, with reference to FIGS. 17 and 18.

Figure 9:
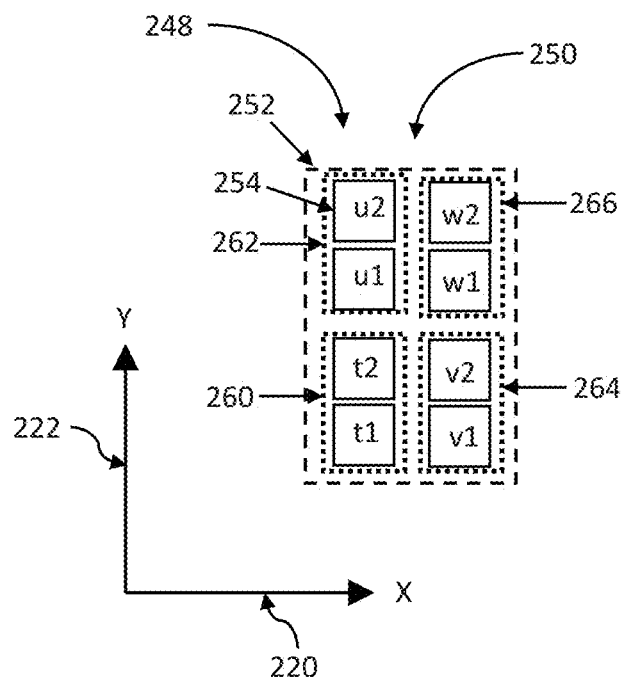

FIG. 9 is a top view of an example MEMS portion 250 of a force-measuring device 248. The MEMS portion includes a two-dimensional PMFE array 252 containing eight PMFEs (254). The PMFEs are arranged into four sets (260, 262, 264, and 266), where each set is associated with a different X and Y location. Therefore, the PMFE array 252 achieves a two-dimensional positional resolution of strain (force) measurement. This capability is similar to that of PMFE array 232. Each PMFE set contains two PMFEs. In the example shown, set 260 contains PMFEs t1 and t2, set 262 contains PMFEs u1 and u2, set 264 contains PMFEs v1 and v2, and set 266 contains PMFEs w1 and w2. PMFE array 252 is similar to PMFE array 232 in the total number of PMFEs, the number of PMFE sets, and the number of PMFEs in each set. Note that the size of each PMFE is smaller than in FIG. 8, making it possible to arrange two PMFEs in each set side-by-side in the Y-direction. As a result, the overall footprint of MEMS portion 250 is smaller than that of MEMS portion 230. It is preferable that each PMFE has lateral dimensions (X-direction and Y-direction) no greater than 2.5 mm by 2.5 mm.

Figure 10:
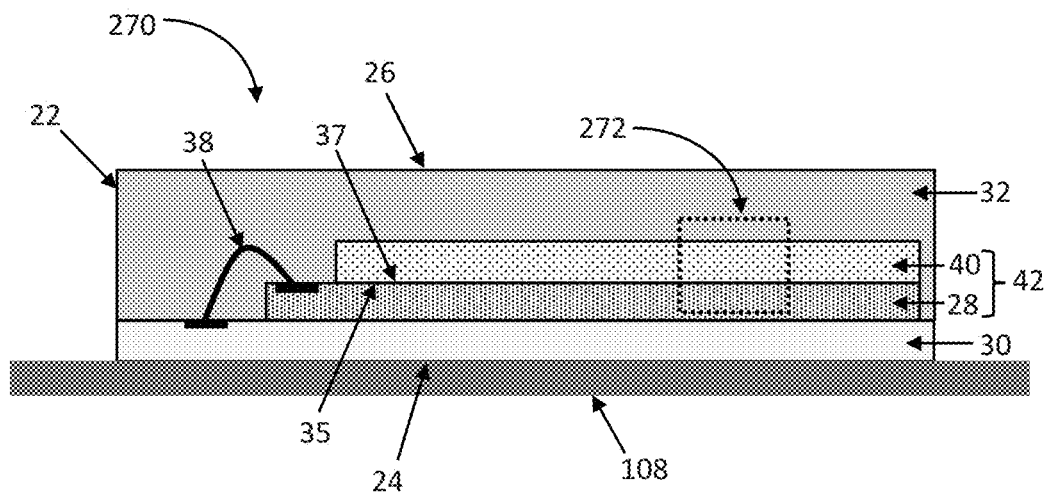
FIG. 10 is a schematic cross-sectional view of another force-measuring device.

FIG. 10 is a schematic cross-sectional view of a force-measuring device 270. Force-measuring device 270 is an alternative to force-measuring device 20 (FIG. 2). Force-measuring device 270 is shown encased in a package 22, with top surface 26 and electrical interconnection surface (bottom surface) 24. The force-measuring device 270 includes a package substrate 30, semiconductor die (semiconductor chip) 28 mounted to the package substrate 30, a MEMS die (chip) 40 on the semiconductor die 28, and an encapsulating adhesive 32, such as an epoxy adhesive. Force-measuring device 270 differs from force measuring device 20 (FIG. 2) in that it additionally includes a MEMS chip 40. Since the MEMS chip 40 includes the MEMS structures such as PMFEs, the semiconductor die 28 need not include the MEMS portion (compare to FIG. 2). The MEMS chip 40 and the semiconductor chip 28 are shown bonded together in a bonded chip assembly (bonded MEMS-semiconductor chip) 42. This is an example of the semiconductor substrate and the MEMS substrate being attached to each other at their major surfaces (35, 37). The major surface of MEMS chip facing towards the semiconductor chip is 35 and the major surface of semiconductor chip facing towards the MEMS chip is 37. A selected portion 272 of the bonded chip assembly 42 is shown in cross-section in FIG. 11.

Figure 11:
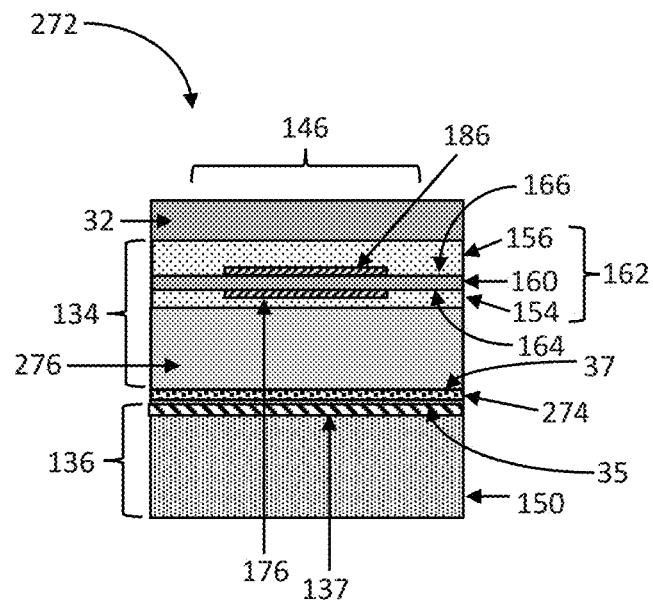
FIG. 11 is a schematic cross-sectional view of a PMFE of the force-measuring device of FIG. 10.

FIG. 11 is a schematic cross-sectional view of a portion 272 of the force-measuring device 270 of FIG. 10. The semiconductor die 28 includes an ASIC portion 136 and the MEMS chip includes a MEMS portion 134. The ASIC portion 136 consists of a semiconductor substrate 150 and signal processing circuitry 137 thereon or therein. Typically, the semiconductor substrate is a silicon substrate, but other semiconductor substrates such as silicon-on-insulator (SOI) substrates can also be used. The MEMS portion 134 includes a MEMS substrate 276 and MEMS structures disposed on the MEMS substrate 276. Suitable MEMS substrates include silicon and glass. MEMS structures shown in FIG. 11 include the piezoelectric stack 162 (piezoelectric layer 160, bottom mechanical layer 154, top mechanical layer 156), a first PMFE electrode 176, and a second PMFE electrode 186. A wafer bond layer 274, located between the ASIC portion 136 and the MEMS portion 134, bonds the two portions together. A method 660 of making the force-measuring device 270 and of making an input system incorporating the force-measuring device 270 is described with reference to FIG. 28.

Figure 12:
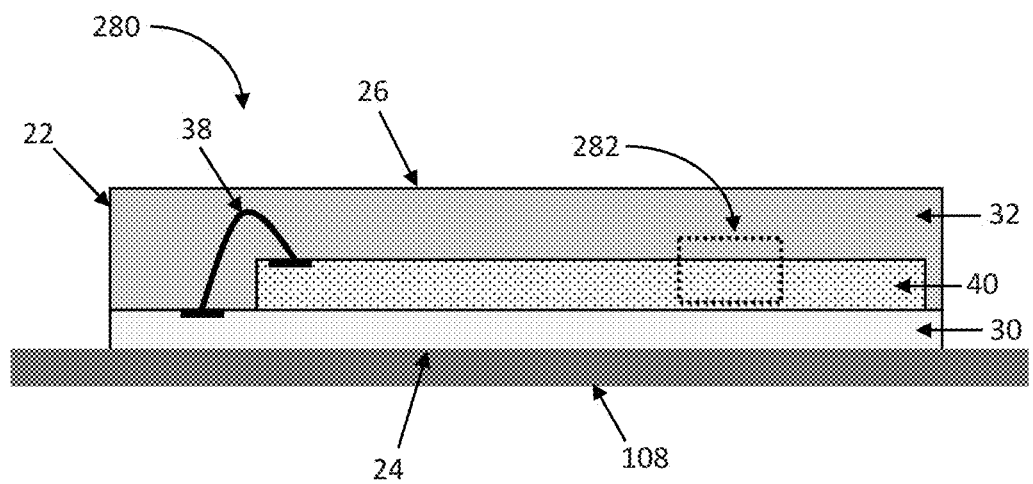
FIG. 12 is a schematic cross-sectional view of a MEMS device.

FIG. 12 is a schematic cross-sectional view of a MEMS device 280, encased in a package 22. Unlike the force-measuring devices 20 (FIG. 2) and 270 (FIG. 8), MEMS device 280 itself is devoid of the signal processing circuitry necessary for operation of the PMFEs. However, when connected to the necessary signal processing circuitry, MEMS device 280 can be configured to operate as a force-measuring device. Referring to the example shown in FIG. 1, this signal processing circuitry can be contained in ICs 114, for example. Hence, for ease of discussion, MEMS device 280 is sometimes referred to as a force-measuring device. MEMS device 280 is shown encased in a package 22, with top surface 26 and electrical interconnection surface (bottom surface) 24. The MEMS device 280 includes a package substrate 30, MEMS chip 40 mounted to the package substrate 30, and an encapsulating adhesive 32, such as an epoxy adhesive. A selected portion 282 of the MEMS chip is shown in cross-section in FIG. 13.

Figure 13:
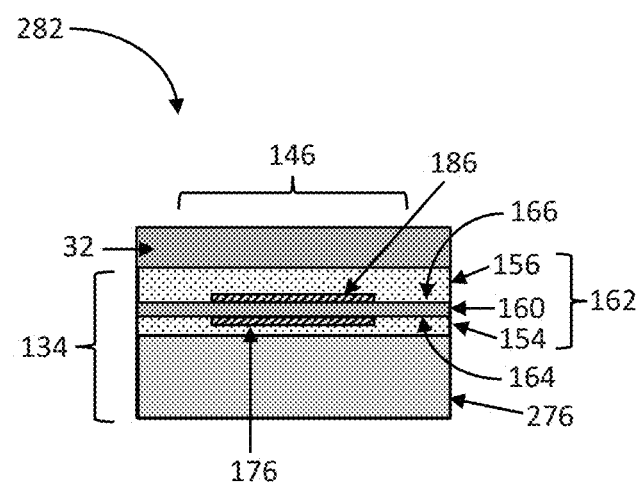
FIG. 13 is a schematic cross-sectional view of a PMFE of the MEMS device of FIG. 12.

FIG. 13 is a schematic cross-sectional view of a portion 282 of the MEMS device 280 of FIG. 12. The MEMS chip 40 includes a MEMS portion 134. The MEMS portion 134 includes a MEMS substrate 276 and MEMS structures disposed on the MEMS substrate 276. Suitable MEMS substrates include silicon and glass. MEMS structures shown in FIG. 13 include the piezoelectric stack 162 (piezoelectric layer 160, bottom mechanical layer 154, top mechanical layer 156), a first PMFE electrode 176, and a second PMFE electrode 186. A method 670 of making the MEMS device 280 and of making an input system incorporating the MEMS device 280 is described with reference to FIG. 29. If implementing a force-measuring device using a MEMS device 280, the signal processing circuitry 137 would be implemented somewhere outside of the MEMS device 280, such as in another IC 114 (FIG. 1).

Figure 14:
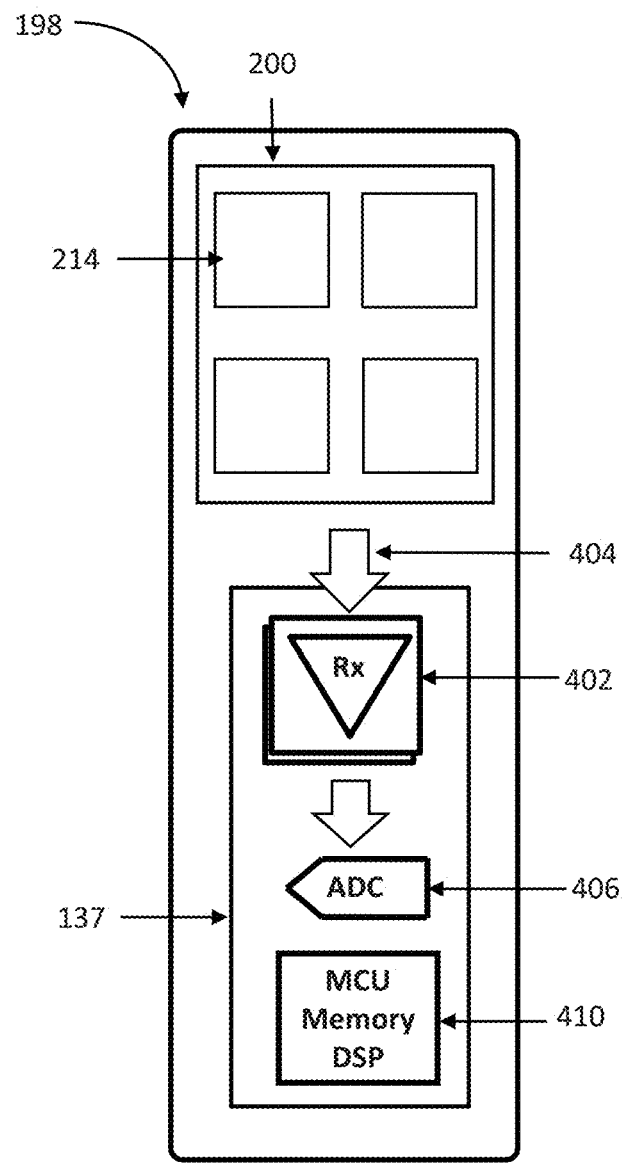
FIG. 14 is an electronics block diagram of a force-measuring device.

FIG. 14 is an electronics block diagram of the force-measuring device 198, including a MEMS portion 200 and signal processing circuitry 137. The MEMS portion includes PMFEs 214. Signal processing circuitry 137 includes amplifiers (402) and analog-to-digital converters (ADCs) (406). Voltage signals read from PMFEs 214 reach amplifiers 402 via electrical interconnections 404 and get amplified by the amplifiers 402. These amplified voltage signals are sent to ADC 406 to be converted to digital signals which can be processed or stored by other circuit blocks 410. The other circuit blocks 410 could be microcontrollers (MCUs), memories, and digital signal processors (DSPs), for example. Force-measuring device 198 can be implemented as a semiconductor die including ASIC and MEMS portions (e.g., force-measuring device 20 of FIG. 2) or as an assembly of semiconductor and MEMS chips (e.g., force-measuring device 270 of FIG. 10).

Figure 15:
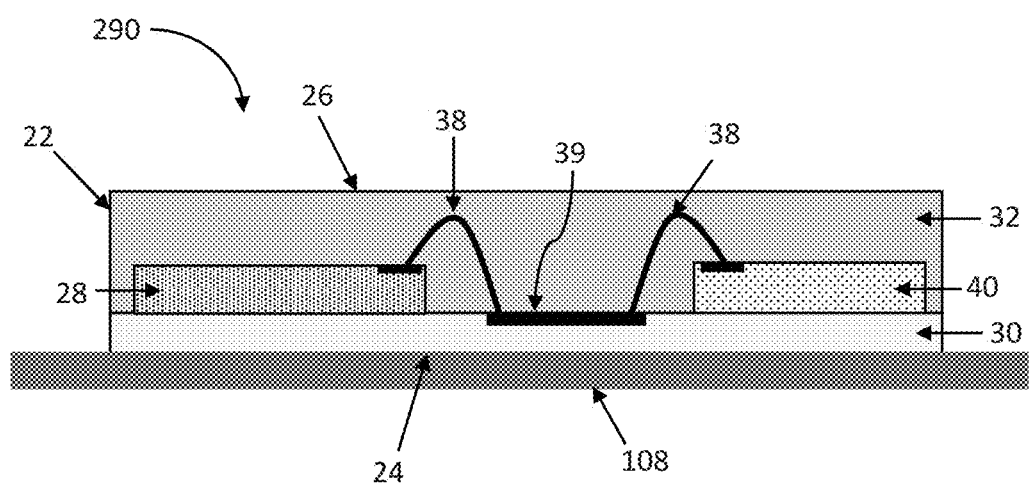
FIG. 15 is a schematic cross-sectional view of another force-measuring device.

FIG. 15 is a schematic cross-sectional view of a force-measuring device 290, encased in a package 22. Force-measuring device 290 differs from force-measuring device 270 (FIG. 10) in that the MEMS chip 40 and the semiconductor chip 28 are arranged side-by-side. In the example shown, there is wiring 39 to connect to the individual wire bond connections 38. The wiring 39 and wire bond connections 38, in combination, correspond to the electrical interconnections 404 between the PMFEs 214 (in MEMS chip 40) and the signal processing circuitry 137 (in the semiconductor chip 28). A method 660 of making the force-measuring device 290 and of making an input system incorporating the force-measuring device 290 is described with reference to FIG. 28.

Figure 16:
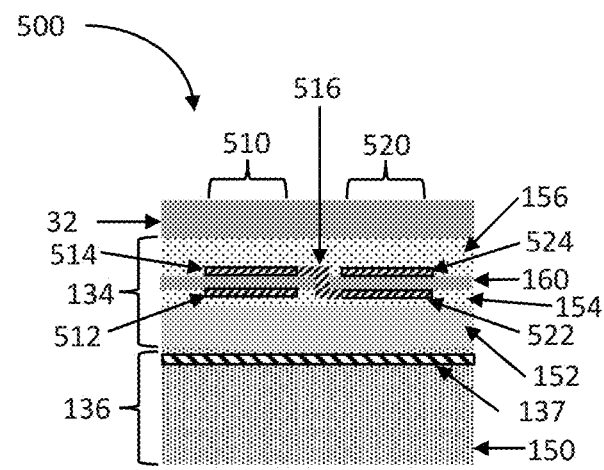
FIG. 16 is a schematic cross-sectional view of a set (pair) of PMFEs.

FIG. 16 is a schematic cross-sectional view of a set 500 of PMFEs 510 and 520. Also shown is the ASIC portion 136 that is under the PMFEs 510, 520 and the encapsulating adhesive 32 that is above the PMFEs 510 and 520. FIG. 16 shows the PMFE in a quiescent state analogous to the quiescent state described with reference to FIG. 3. A PMFE was described with reference to FIG. 3. In the example shown, the piezoelectric stack includes a piezoelectric layer 160, a top mechanical layer 156, and a bottom mechanical layer 154. In a deformed state (shown in FIGS. 4, 5, and 6, for example), an electrical charge is generated between the PMFE electrodes 512 and 514 of first PMFE 510 and between the PMFE electrodes 522 and 524 of the second PMFE 520.

Figure 17:
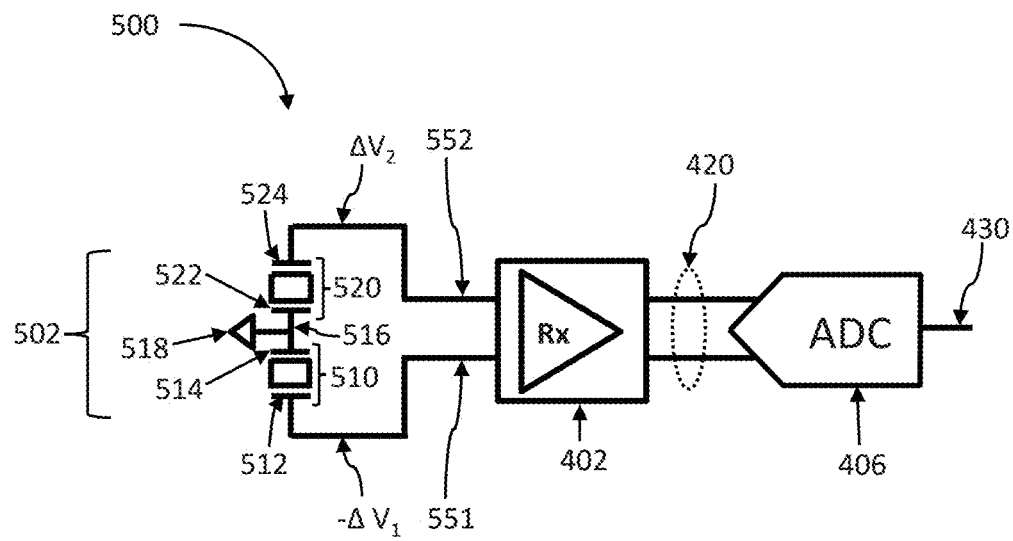
FIG. 17 is a block diagram illustrating the electrical connections of the PMFE pair of FIG. 16 to related signal processing circuitry.

For each PMFE (510, 520), the first PMFE electrode (512, 522), the second PMFE electrode (514, 524), and the respective portion of the piezoelectric layer 160 between them constitute a piezoelectric capacitor. FIG. 17 is a block diagram illustrating the electrical connections of the PMFE set (pair) to certain portions of the signal processing circuitry 137. In FIG. 17, we show each PMFE (510, 520) as a piezoelectric capacitor. PMFEs 510 and 520 are connected in series via a wire 516 that includes a via that penetrates the piezoelectric layer 160 (FIG. 16). Wire 516 connects second electrode (top electrode) 514 of first PMFE 510 to the first electrode (bottom electrode) 522 of the second PMFE 512. The outermost electrodes of the PMFE electrodes in the series 502 are first electrode 512 of the first PMFE 510 and the second electrode 524 of the second PMFE 520. These outermost electrodes of the PMFE electrodes in the series 502 are connected as differential inputs 551, 552 to the amplifier circuitry 402 of the signal processing circuitry 137. The voltage signals at inputs 551, 552 are amplified by the amplifier circuitry 402. Amplified voltage signals 420 are output from the amplifier circuitry 402 to the analog-to-digital converter (ADC) 406. Digital signals (PMFE digital data) 430 are output from the ADC 406.

As shown in the example of FIG. 17, wire 516 is tied to a common node 518. In this case, we can refer to the node between the two adjacent PMFEs 510, 520 connected in series as a common node. If the voltage of the common node is held at 0 V, the voltage signal input to input 551 can be expressed as $-\Delta V_1$, and the voltage signal input to input 552 can be expressed as $\Delta V_2$, where the subscripts refer to the first PMFE (510) or second PMFE (520). An advantage of a node between adjacent PMFEs connected in series being a common node is that voltage offsets from the common node voltage are reduced, simplifying subsequent amplification of low-voltage signals.

Figure 18:
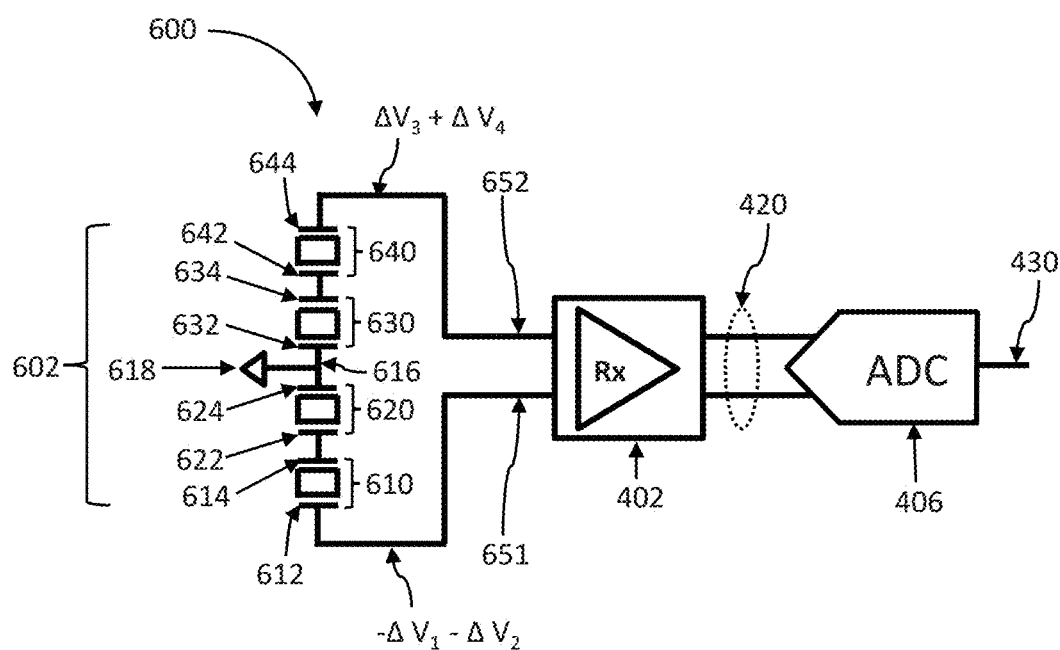
FIG. 18 is a block diagram illustrating the electrical connections of a set of PMFEs to related signal processing circuitry.

FIG. 18 is a block diagram illustrating the electrical connections of a PMFE set (600) to certain portions of the signal processing circuitry 137. FIG. 18 is similar to FIG. 17 except that there are four PMFEs in the set and these four PMFEs are connected in series. The second electrode 614 of the first PMFE 610 is connected to the first electrode 622 of the second PMFE 620, the second electrode 624 of the second PMFE 620 is connected to the first electrode 632 of the third PMFE 630, and the second electrode 634 of the third PMFE 630 is connected to the first electrode 642 of the fourth PMFE 640. The outermost electrodes of the PMFE electrodes in the series 602 are first electrode 612 of the first PMFE 610 and the second electrode 644 of the fourth PMFE 640. These outermost electrodes of the PMFE electrodes in the series 602 are connected as differential inputs 651, 652 to the amplifier circuitry 402 of the signal processing circuitry 137. The voltage signals at inputs 651, 652 are amplified by the amplifier circuitry 402. Amplified voltage signals 420 are output from the amplifier circuitry 402 to the analog-to-digital converter (ADC) 406. Digital signals (PMFE digital data) 430 are output from the ADC 406.

Wire 616 connects the second electrode 624 of the second PMFE 620 to the first electrode 632 of the third PMFE 630. Wire 616 is tied to a common node 618. If the voltage of the common node is held at 0 V, the voltage signal input to input 651 can be expressed as $-\Delta V_1 - \Delta V_2$, and the voltage signal input to input 652 can be expressed as $\Delta V_3 + \Delta V_4$, where the subscripts refer to the first PMFE (610), second PMFE (620), third PMFE (630), and fourth PMFE (640).

In FIG. 1, touch-sensing subsystem 106 is shown implemented as a packaged chip and can include ultrasonic transducers such as piezoelectric micromechanical ultrasonic transmitters (PMUTs) and capacitive micromechanical ultrasonic transmitters (CMUTs). An example PMUT 300 is shown in cross section in FIG. 19. The PMUT 300 includes a substrate 302, a patterned anchor layer 304 overlying the substrate 302, a cavity 306 laterally bounded by the anchor layer 304, and a respective portion of a thin-film piezoelectric stack 312 overlying the cavity 306 and the substrate 302. In the example shown, the thin-film piezoelectric stack 312 includes a piezoelectric layer 310 and a bottom mechanical layer 314 attached to or adjacent to (coupled to) the bottom surface of the piezoelectric layer. In other examples, a top mechanical layer can be attached to or adjacent to (coupled to) the top surface of the piezoelectric layer, and in yet other examples top and bottom mechanical layers can be attached to or adjacent to (coupled to) the top and bottom surfaces of the piezoelectric layer, respectively. The mechanical layer(s) adjust the mechanical properties of the thin-film piezoelectric stack 312. The PMUT includes a first PMUT electrode 322 positioned on a first side (bottom surface) of the piezoelectric layer 310 and a second PMUT electrode 324 positioned on a second side (top surface) opposite the first side. The first PMUT electrode 322, the second PMUT electrode 324, and the portion of the piezoelectric layer 310 between them constitute a piezoelectric capacitor. The cavity 306 is positioned between the thin-film piezoelectric stack 162 and the substrate 302.

Figure 19:
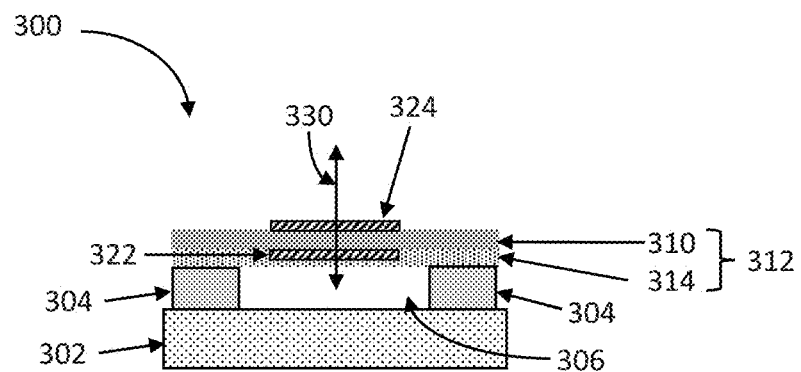
FIGS. 19, 20, and 21 are schematic cross-sectional views of a piezoelectric micromechanical ultrasonic transducer (PMUT).
Figure 20:
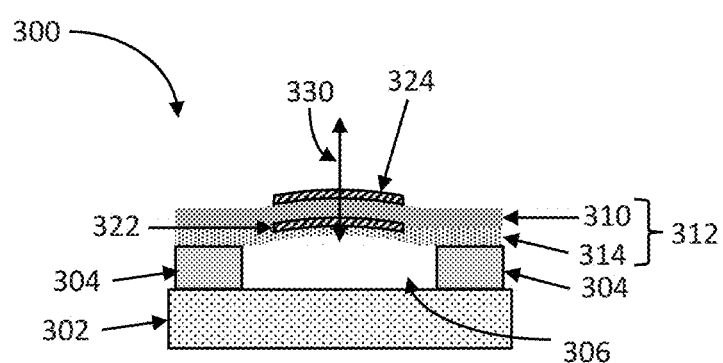
Figure 21:
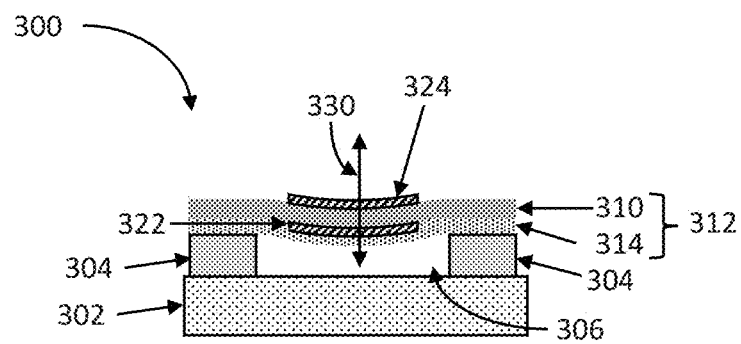

A PMUT can be configured as a transmitter and/or a receiver. Consider the case of configuring PMUT 300 as a transmitter. FIG. 19 shows the PMUT transmitter in a quiescent state, in which there is no voltage applied between the PMUT electrodes (322, 324). The piezoelectric layer 310 has a built-in polarization (piezoelectric polarization) that is approximately parallel to normal direction 330. Normal direction 330 is normal to the piezoelectric layer 310. The signal processing circuitry applies a time-varying voltage signal $V_{p1}(t)$ between the PMUT electrodes (322, 324), which causes the portion of the piezoelectric layer 310 between the PMUT electrodes (322, 324) to undergo flexural motion between the upward extremum (shown in FIG. 20) and the downward extremum (shown in FIG. 21). As a result, the PMUT transmitter generates (transmits), upon application of the time-varying voltage signal, ultrasound signals propagating along the normal direction 330.

PMUT 300 can also be configured as a receiver. FIG. 19 shows the PMUT receiver in a quiescent state, in which there is no voltage (zero voltage) generated between the PMUT electrodes (322, 324). When an ultrasound pressure wave is incident on the PMUT receiver, for example downwards along the normal direction 330, the portion of the piezoelectric layer 310 between the PMUT electrodes (174, 184) undergoes flexural motion between a downward extremum (shown in FIG. 21) and an upward extremum (shown in FIG. 20). As a result, a time-varying voltage signal $V_{p2}(t)$ is generated between the PMUT electrodes (322, 324).

Figure 22:
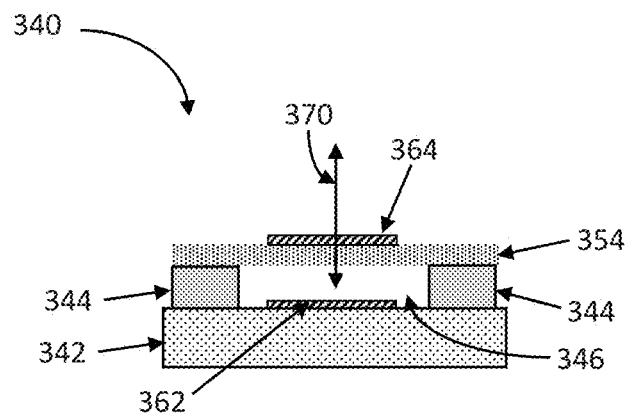
FIGS. 22, 23, and 24 are schematic cross-sectional views of a capacitive micromechanical ultrasonic transducer (CMUT).

An example CMUT 340 is shown in cross section in FIG. 22. The CMUT 340 includes a substrate 342, a patterned anchor layer 344 overlying the substrate 342, a cavity 346 laterally bounded by the anchor layer 344, and a respective portion of a mechanical layer 354 overlying the cavity 346 and the substrate 342. In the example shown, a first CMUT electrode 362 is on the substrate in the cavity 346, and a second CMUT electrode 364 overlies the cavity 346 and the first CMUT electrode. The second CMUT electrode 364 is attached to mechanical layer 354. In this case, the mechanical layer 354 mechanically supports the second CMUT electrode 364 and is also an insulating layer. The cavity 346 is positioned between the second CMUT electrode 364 and the mechanical layer 354 on one side and the substrate 342 and the first CMUT 362 on another side. The first CMUT electrode 362, the second CMUT electrode 364, and the dielectric between them (a respective portion of the mechanical layer 354 and the space in cavity 346) constitute a capacitor.

Figure 23:
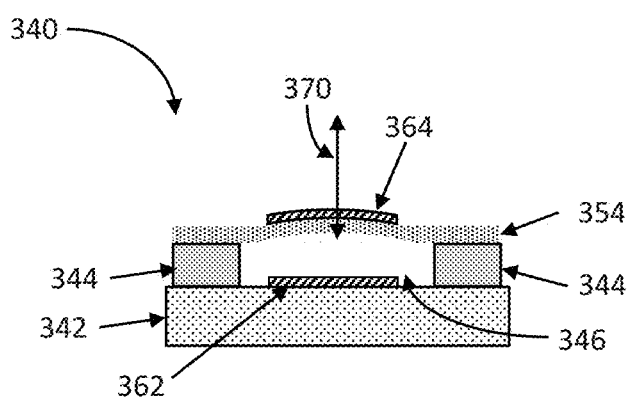
Figure 24:
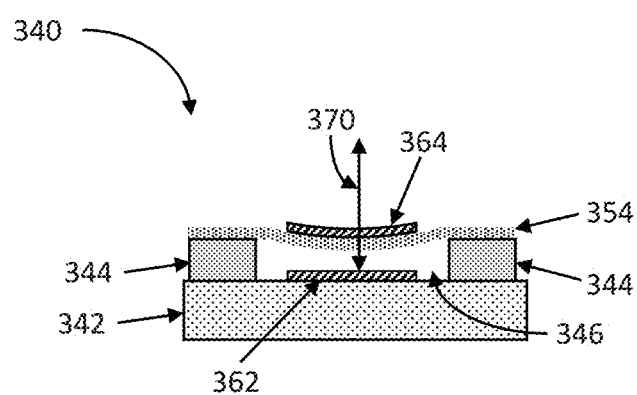

A CMUT can be configured as a transmitter and/or a receiver. Consider the case of configuring CMUT 340 as a transmitter. FIG. 22 shows the CMUT transmitter in a quiescent state, in which there is no voltage applied between the CMUT electrodes (362, 364). Normal direction 370 is normal to the mechanical layer 354. The signal processing circuitry applies a time-varying voltage signal $V_{c1}(t)$ between the CMUT electrodes (362, 364), which causes electrostatic attraction and repulsion between the CMUT electrodes (362, 364), which in turn causes the portion of the mechanical layer 354 above the cavity 346 to undergo flexural motion between the upward extremum (shown in FIG. 23) and the downward extremum (shown in FIG. 24). As a result, the CMUT transmitter generates (transmits), upon application of the time-varying voltage signal, ultrasound signals propagating along the normal direction 370.

CMUT 340 can be configured as a receiver. FIG. 22 shows the CMUT receiver in a quiescent state, in which there is no voltage (zero voltage) generated between the CMUT electrodes (362, 364). When an ultrasound pressure wave is incident on the CMUT receiver, for example downwards along the normal direction 370, the portion of the mechanical layer 354 above the cavity 346 undergoes flexural motion between a downward extremum (shown in FIG. 24) and an upward extremum (shown in FIG. 23). As a result, a time-varying voltage signal $V_{e2}(t)$ is generated between the CMUT electrodes (362, 364).

Figure 25:
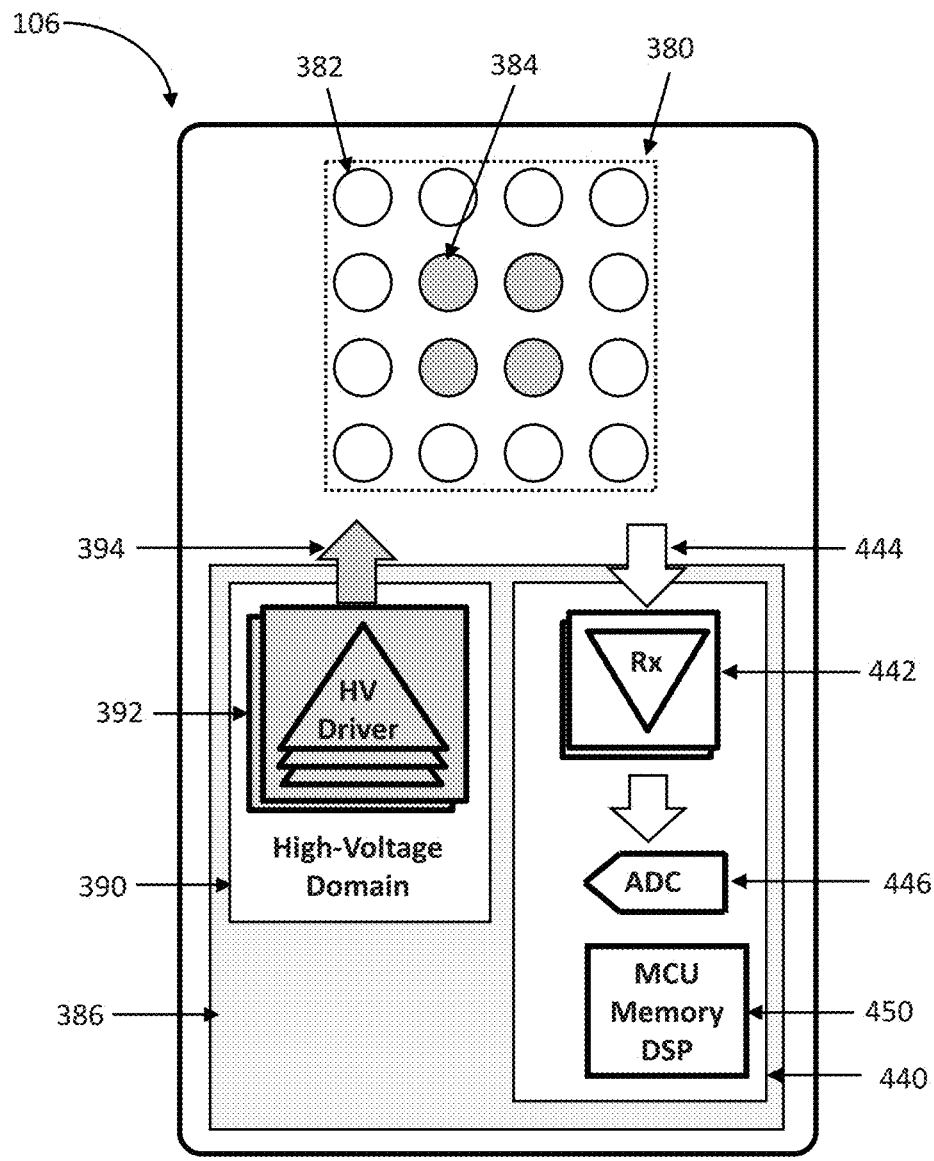
FIG. 25 is an electronics block diagram of a touch-sensing subsystem including ultrasonic transducers and related signal processing circuitry.

FIG. 25 is an electronics block diagram of an example touch-sensing subsystem 106, including ultrasonic transducers 380 and signal processing circuitry 386 coupled to the ultrasonic transducers. For example, the ultrasonic transducers can be PMUTs and/or CMUTs. The ultrasonic transducers 380 include transmitters 382 (shown as white circles) and receivers 384 (shown as grey circles). Signal processing circuitry 386 includes a high-voltage domain 390 and a low-voltage domain 440. The high-voltage domain 390 is capable of operating at higher voltages required for driving the ultrasonic transmitters. The high-voltage domain includes high-voltage transceiver circuitry 392, including high-voltage drivers. The high-voltage transceiver circuitry 392 is connected to the ultrasonic transmitters (e.g., PMUT transmitters or CMUT transmitters), via electrical interconnection 394. The high-voltage transceiver is configured to output voltage pulses of 5 V or greater, depending on the requirements of the ultrasonic transmitters. The low-voltage domain 440 includes amplifiers 442 and analog-to-digital converters (ADCs) 446. Voltage signals read from the ultrasonic receivers 384 reach amplifiers 442 via electrical interconnections 444 and get amplified by the amplifiers 442. The amplified voltage signals are sent to ADC 446 to be converted to digital signals which can be processed or stored by other circuit blocks 450. The other circuit blocks 450 could be microcontrollers (MCUs), memories, and digital signal processors (DSPs), for example.

Figure 26:
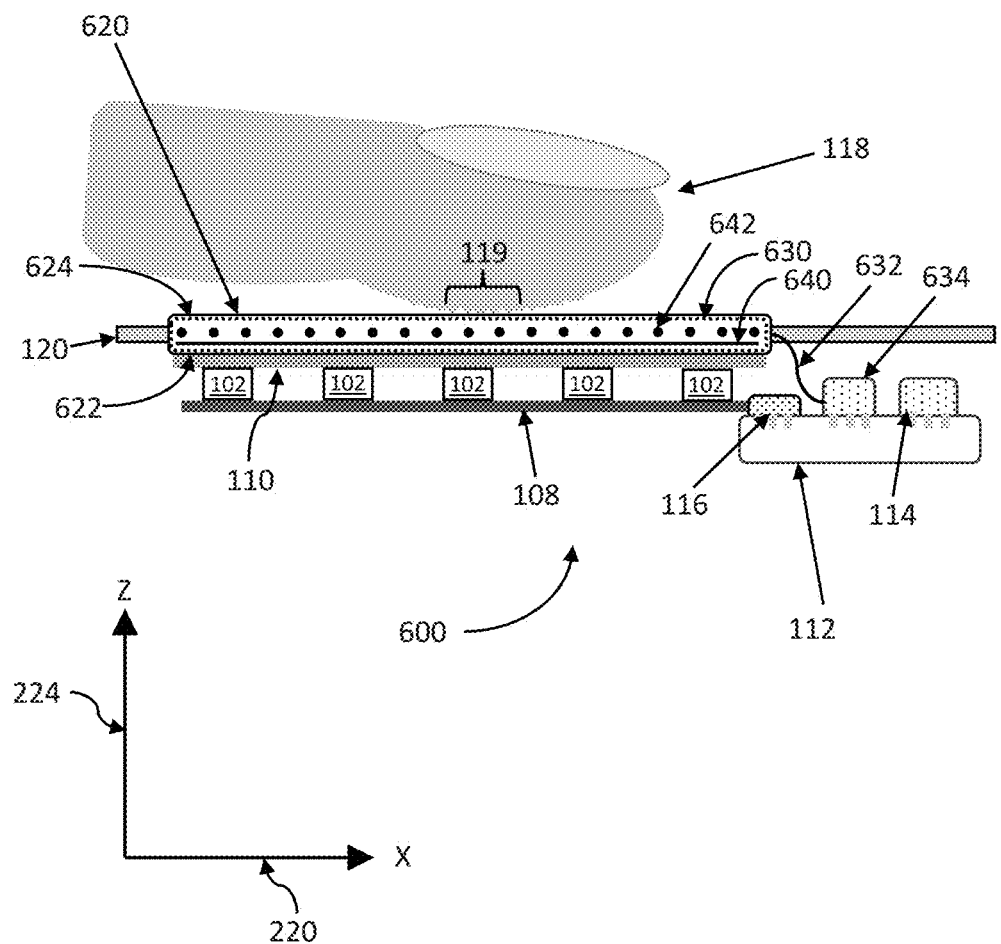
FIG. 26 is a schematic view of another illustrative force-measuring and touch-sensing system.

FIG. 26 is a schematic view of an input system (force-measuring and touch-sensing system) 600. The force-measuring and touch-sensing system 600 includes one or more force-measuring devices 102 (five are shown) and a capacitive touch panel assembly 620. In other examples, it is possible for a system to have less than five or more than five force-measuring devices. In the example shown in FIG. 26, each of the force-measuring devices 102 is shown in the form of a packaged chip. The force-measuring device chips 102 are mounted to a flexible circuit substrate 108 (e.g., an FPC or flexible printed circuit). The flexible circuit substrate 108 is electrically and mechanically connected to a printed circuit board (PCB) 112 via a connector 116. Additionally, a touch panel controller 634 and other integrated circuits (other ICs) 114 are mounted on the PCB 112. Generally, signal processing circuitry can be implemented in the force-measuring device 102, the touch panel controller 634, and/or the other ICs 114. The signal processing circuitry can be implemented in a single IC, or in multiple ICs. Other ICs 114 can include a microcontroller (MCU), microprocessor (MPU), and/or a digital signal processor (DSP), for example. The ICs 114 could be used to run programs and algorithms to analyze and categorize events based on data received from the sensor chips 102.

In the example shown, the capacitive touch panel assembly 620 is embedded in a cover layer 120. The touch panel assembly 620 has an exposed outer surface 624 and an inner surface 622. The force-measuring devices 102 are adhered to the inner surface 622 of the touch panel assembly 620 by a layer of adhesive 110. The choice of adhesive 110 is not particularly limited as long as the force-measuring devices 102 remain attached to the cover layer. The adhesive 110, the cover layer 120, the force-measuring devices 102, the flexible circuit substrate 108, and other ICs 114, have been discussed with reference to FIG. 1.

The capacitive touch panel assembly 620 includes a grid region 630 containing wiring traces 640 extending in the X-direction (220) and wiring traces 642 extending in the Y-direction (into the page, perpendicular to the X-direction 220 and Z-direction 224). The capacitive touch panel assembly 620 is coupled to the touch panel controller IC 634 via a connector 632. For example, the touch panel controller 634 contains signal processing circuitry that measures the capacitance at each intersection of the X-direction wiring traces 640 and Y-direction wiring traces 642. For example, when a finger 118 touches a region of the capacitive touch panel assembly 620, the measured capacitance in the touched region changes Preferably, the capacitive touch panel assembly also includes a display, such as a deformable OLED (organic light-emitting diode) display or a deformable liquid crystal display (LCD). Preferably, the capacitive touch panel assembly 620 is sufficiently deformable such that when a force is imparted to the touch panel assembly on the outer surface 624, the force-measuring devices 102 that are adhered to the capacitive touch panel assembly 620 at its inner surface 622 also undergo deformation (low-frequency mechanical deformation, see FIGS. 4, 5, and 6.

Figure 27:
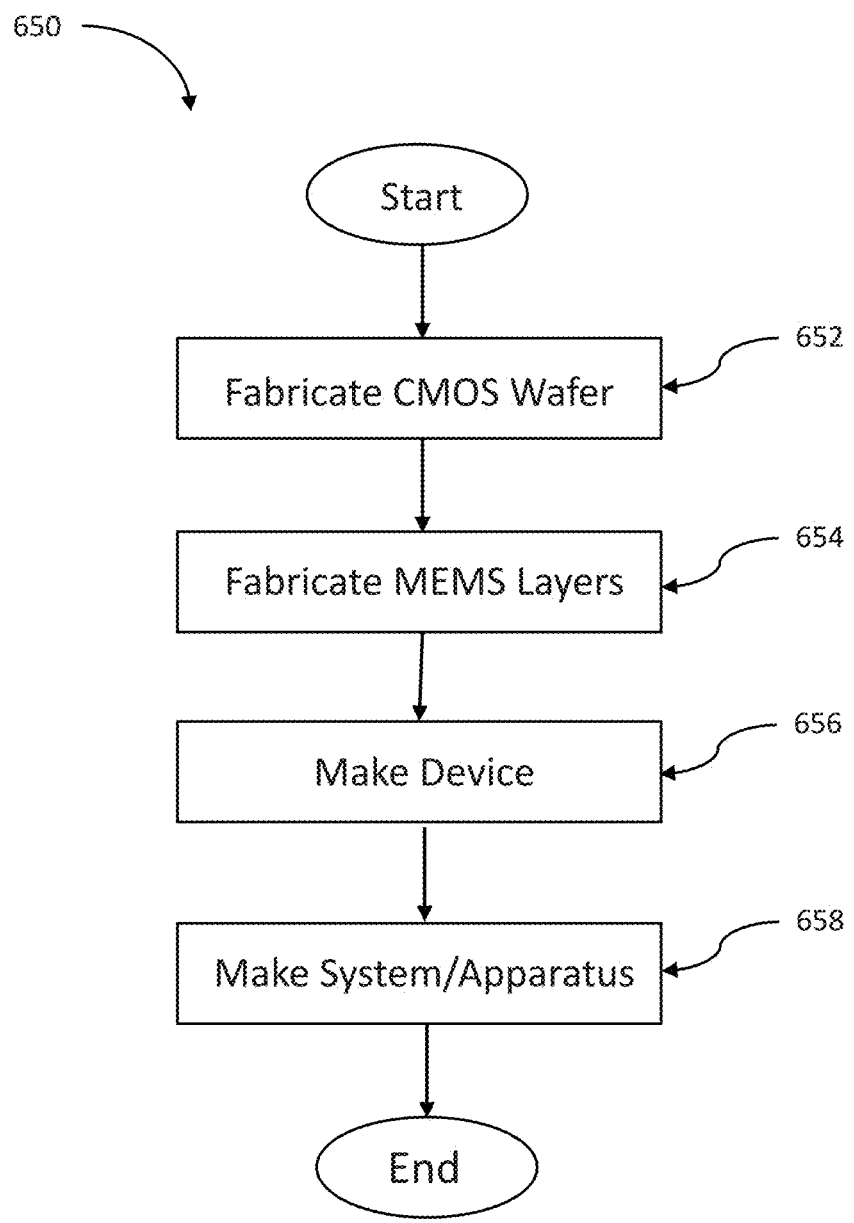
FIGS. 27, 28, and 29 are flow diagrams of methods of making force-measuring devices and input systems and/or apparatuses.

FIG. 27 shows a flow diagram of a method 650 of making a force-measuring device (e.g., 20 of FIG. 2) and a system or an apparatus (e.g., 100 of FIG. 1, 600 of FIG. 26). Method 650 is applicable to a force-measuring device in which a semiconductor substrate (chip) includes piezoelectric force-measuring elements (PMFEs) and signal processing circuitry. Method 650 includes steps 652, 654, 656, and 658. At step 652, CMOS circuits are fabricated using a semiconductor substrate. The ASIC portion 136 (FIG. 3) including signal processing circuitry 137 is fabricated on a semiconductor substrate (wafer) 150 using a CMOS fabrication process. At step 654, the MEMS portion 134 is fabricated on top of the ASIC portion 136. At step 656, the force-measuring devices (20) are made. This step 656 includes, for example, the singulation of the wafer into dies, the mounting of dies onto a package substrate 30 (FIG. 2), the forming of wire-bond connections or other electrical connections, and the molding (encapsulating) of the entire assembly including the semiconductor die (including PMFEs) and the package substrate 30 in the epoxy adhesive 32. The making of the force-measuring device is complete at the end of step 656.

At step 658, the force-measuring device(s) are incorporated into an input system or an apparatus (e.g., 100 or 600). For example, the apparatus can be a mobile appliance (e.g., Smartphone, tablet computer, laptop computer), a household appliance (e.g., television, washing machine, drier, light switches, air conditioner, refrigerator, oven, remote controller devices), a medical appliance, an industrial appliance, an office appliance, an automobile, or an airplane, for example. This step 658 includes, for example, the mounting of one or more force-measuring devices and to a flexible circuit substrate and adhering the force-measuring devices to an interior surface of a cover layer of the system or to an interior surface of a capacitive touch panel assembly. Additionally, this step might include mounting of force-measuring devices and other ICs onto the respective circuit substrates.

Figure 28:
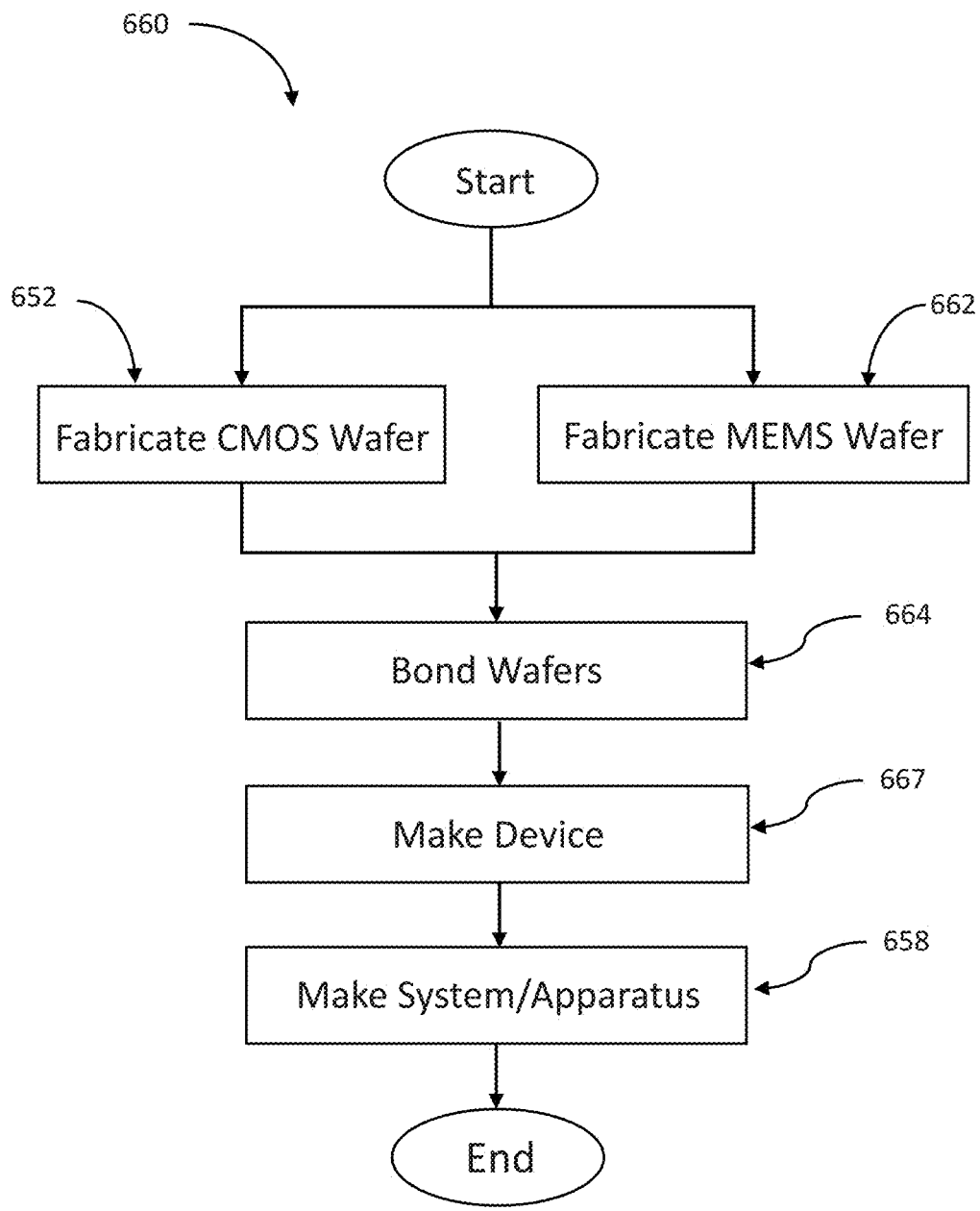

FIG. 28 shows a flow diagram of a method 660 of making a force-measuring device (e.g., 270 of FIG. 10, 290 of FIG. 15) and a system or an apparatus (100, 600). Method 660 is applicable to a force-measuring device in which a MEMS substrate (chip) includes piezoelectric force-measuring elements (PMFEs) and a semiconductor substrate (chip) includes signal processing circuitry. Method 650 includes steps 652, 662, 664, 667, and 658. At step 652, CMOS circuits are fabricated using a semiconductor substrate. This step has been described with reference to FIG. 27. At step 662, a MEMS structures are fabricated using a MEMS substrate, such as silicon or glass. Step 662 includes the fabrication of PFMEs and more generally, MEMS structures. In the case of a force-measuring device 270 that includes a bonded assembly of a MEMS substrate and semiconductor substrate, step 664 is carried out. At step 664, the semiconductor substrate and the MEMS substrate attached by wafer bonding, resulting in the substrates being attached to each other at their major surfaces with a wafer bond layer (274) between the substrates. At step 667, the force-measuring devices (270, 290) are made. In the case of force-measuring device 290 (FIG. 15), this step 667 includes, for example, the singulation of the semiconductor substrates into semiconductor dies (chips) 28 and the singulation of the MEMS substrates into MEMS dies (chips) 40, the mounting of dies onto a package substrate 30 (FIG. 15), the forming of wire-bond connections or other electrical connections, and the molding (encapsulating) of the entire assembly including the semiconductor die 28, the MEMS die 40, and the package substrate 30 in the epoxy adhesive 32. In the case of force-measuring device 270 (FIG. 10), this step 667 includes, for example, the singulation of the bonded MEMS substrate-semiconductor substrate assembly into a bonded MEMS-semiconductor chip 42 (FIG. 10), the mounting of bonded MEMS-semiconductor chip 42 onto a package substrate 30 (FIG. 10), the forming of wire-bond connections or other electrical connections, and the molding (encapsulating) the entire assembly including the bonded MEMS-semiconductor chip 42 and the package substrate 30 in the epoxy adhesive 32. The making of the force-measuring device is complete at the end of step 667. Subsequently, at step 658, the force-measuring device is incorporated into a system (e.g., 100 or 600), as described with reference to FIG. 28.

Figure 29:
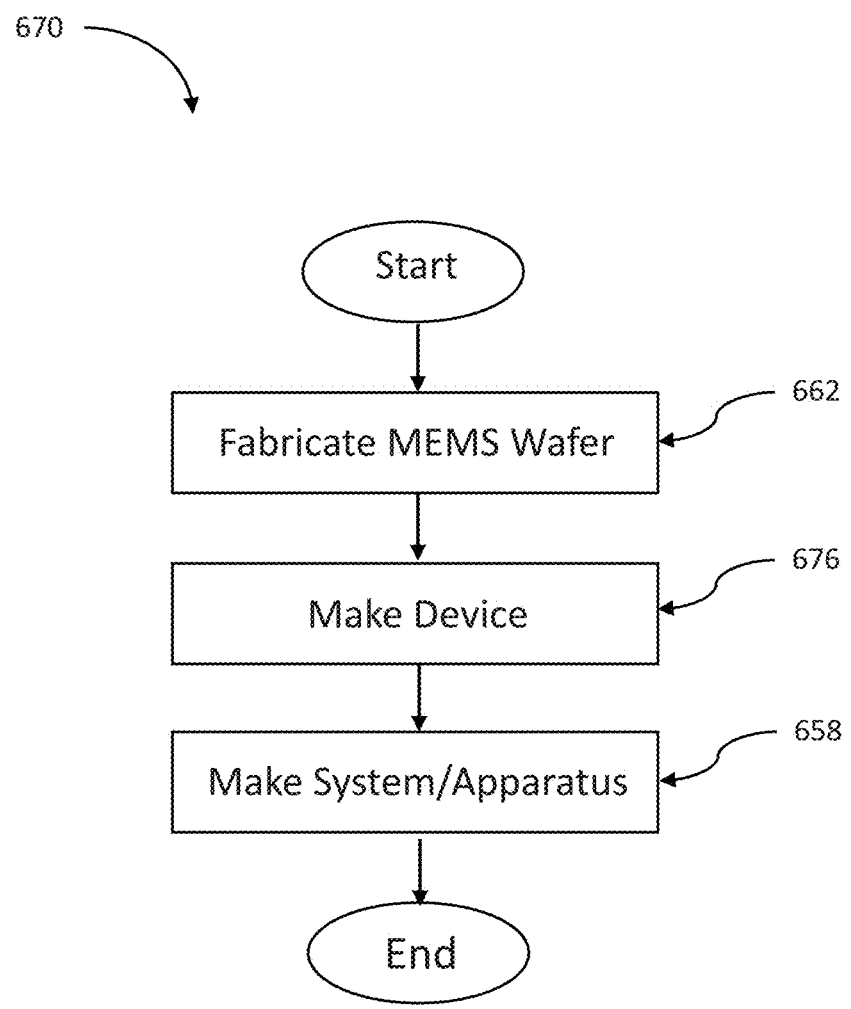

FIG. 29 shows a flow diagram of a method 670 of making a force-measuring device (e.g., 280 of FIG. 12) and a system or an apparatus (100, 600). Method 670 is applicable to a force-measuring device in which a MEMS substrate (chip) includes piezoelectric force-measuring elements (PMFEs). Method 650 includes steps 662, 676, and 658. At step 662, a MEMS wafer is fabricated using a MEMS substrate, as described with reference to FIG. 28. At step 676, the MEMS device is made. This step 676 includes, for example, the singulation of the MEMS wafer into MEMS dies 40, the mounting of MEMS dies 40 onto a package substrate 30, and the molding (encapsulating) of the entire assembly including the MEMS die 40 and the package substrate 30 in the epoxy adhesive 32 (packaging). The making of the MEMS chip is complete at the end of step 676. Subsequently, at step 658, the MEMS device is incorporated into a system (e.g., 100 or 600), as described with reference to FIG. 28. Since the MEMS device 280 does not yet include the signal processing circuitry, signal processing circuitry outside of the MEMS device 280 is coupled to the MEMS device and are incorporated into the system at step 658. Upon completion of step 658, the MEMS device 280 has been configured as a force-measuring device.

An example of PMFE digital data is shown in FIG. 30. FIG. 30 shows a graphical plot 730 of illustrative PMFE digital data, after ADC, during a repetitive touch event. This PMFE digital data corresponds to digital signals 430 output from the ADC 406 (FIG. 17). Graphical plot 730 has a horizontal axis 732 showing time t, in which 1 division corresponds to 2.0 sec, and a vertical axis 734 showing PMFE digital data. Graphical plot 730 includes plot sections 736, 738, and 740 (ordered sequentially). Graphical plot portions 736 and 740 correspond to time periods during which PMFE is in a quiescent state. For example, the PMFE might be in a quiescent state if there is nothing touching or contacting the cover layer. These graphical plot sections 736 and 740 show the baseline signal. Plot section 738 corresponds to repetitive pressing of a digit (e.g., a finger) on the sense region (or another region of the cover layer). There is a pair of maximum PMFE digital data 742 and a minimum PMFE digital data 744 (occurring one after another) corresponding to one repetition of a digit pressing at the sense region and the digit being removed from the sense region. As the digit presses the sense region, the PMFE(s) undergo a first deformation resulting in a first PMFE signal (e.g., maximum PMFE data 742), and as the digit is removed from the sense region, the PMFE(s) undergo a second deformation resulting in a second PMFE signal (e.g., minimum PMFE data 744). In this case, the first and second deformations are in opposite directions and the first and second PMFE signals are of opposite polarities relative to the baseline signal. As illustrated in the example of FIG. 4, the first deformation can be a first deflection during which a first deflection voltage $V_{d1}$ (corresponding to strain of a certain polarity and magnitude) is detectable. This corresponds to PMFEs under tension (see PMFE 146 in FIG. 4). The second deformation can be a second deflection during which a second deflection voltage $V_{d2}$ (corresponding to strain of a certain polarity and magnitude) is detectable. As shown in FIG. 30, the 10 repetitions of the digit pressing at the sense region occur during a time period of approximately 4.1 sec. Accordingly, the repetition rate is approximately 2.4 Hz.

What is claimed is:

1. A system, comprising:
   a force-measuring device; and
   a touch-sensing subsystem;
   wherein the force-measuring device comprises:
     a first substrate;
     a thin-film piezoelectric stack overlying the first substrate and comprising a piezoelectric layer; and
     a plurality of piezoelectric micromechanical force-measuring elements (PMFEs) located at respective lateral positions along the thin-film piezoelectric stack, a signal processing circuitry being coupled to the PMFEs;
   wherein each of the PMFEs comprises: (1) a first electrode, (2) a second electrode, and (3) a respective portion of the thin-film piezoelectric stack, the first electrode and the second electrode being positioned on opposite sides of the piezoelectric layer to constitute a piezoelectric capacitor;
   each of the PMFEs is configured to output voltage signals between the respective first electrode and the respective second electrode (PMFE voltage signals) in accordance with a time-varying strain at the respective portion of the piezoelectric layer between the respective first electrode and the respective second electrode resulting from a low-frequency mechanical deformation of 100 Hz or less; and the signal processing circuitry is configured to read at least some of the PMFE voltage signals.

2. The system of claim 1, wherein:

the first substrate is a micro-electromechanical system (MEMS) substrate;

the force-measuring device additionally comprises a semiconductor substrate; and the signal processing circuitry is on or in the semiconductor substrate.

3. The system of claim 2, wherein the semiconductor substrate and the MEMS substrate are attached to each other at their major surfaces.

4. The system of claim 2, wherein the semiconductor substrate and the MEMS substrate are arranged side-by-side.

5. The system of claim 1, wherein the first substrate is a semiconductor substrate and the signal processing circuitry is on or in the semiconductor substrate.

6. The system of claim 1, additionally comprising a cover layer comprising an outer surface which can be touched by a digit and an inner surface opposite the outer surface, wherein the force-measuring device is coupled to the inner surface.

7. The system of claim 6, wherein the cover layer comprises a material selected from the following: wood, glass, metal, plastic, leather, fabric, and ceramic.

8. The system of claim 1, wherein the touch-sensing subsystem comprises ultrasonic transducers, and the ultrasonic transducers comprise one or more of: capacitive micromachined ultrasonic transducers (CMUTs) and piezoelectric micromachined ultrasonic transducers (PMUTs).

9. The system of claim 1, wherein the touch-sensing subsystem comprises ultrasound transmitters and a high-voltage transceiver circuitry configured to output voltage pulses of 5 V or greater, the high-voltage transceiver circuitry being coupled to at least some of ultrasound transmitters.

10. The system of claim 1, wherein the touch-sensing subsystem comprises a capacitive touch panel assembly and a capacitive touch panel controller coupled to the capacitive touch panel assembly.

11. The system of claim 10, wherein the capacitive touch panel assembly comprises an outer surface which can be touched by a digit and an inner surface opposite the outer surface, the force-measuring device being coupled to the inner surface.

\* \* \* \* \*